United States Patent
Saito et al.

(10) Patent No.: US 11,002,909 B2
(45) Date of Patent: May 11, 2021

(54) OPTICAL INTEGRATED DEVICE AND OPTICAL TRANSMITTER MODULE

(71) Applicant: FURUKAWA ELECTRIC CO., LTD., Tokyo (JP)

(72) Inventors: Yusuke Saito, Tokyo (JP); Tatsuro Kurobe, Tokyo (JP); Tatsuya Kimoto, Tokyo (JP); Shinichi Kamiya, Tokyo (JP)

(73) Assignee: FURUKAWA ELECTRIC CO,. LTD., Tokyo (JP)

( * ) Notice: Subject to any disclaimer, the term of this patent is extended or adjusted under 35 U.S.C. 154(b) by 0 days.

(21) Appl. No.: 16/446,010

(22) Filed: Jun. 19, 2019

(65) Prior Publication Data

US 2019/0302360 A1 Oct. 3, 2019

Related U.S. Application Data

(63) Continuation of application No. PCT/JP2017/045459, filed on Dec. 19, 2017.

(30) Foreign Application Priority Data

Dec. 19, 2016 (JP) .............................. JP2016-245616

(51) Int. Cl.
*G02B 6/14* (2006.01)
*G02B 6/122* (2006.01)
(Continued)

(52) U.S. Cl.
CPC .......... *G02B 6/1228* (2013.01); *G02B 6/122* (2013.01); *G02B 6/12004* (2013.01); *G02B 6/14* (2013.01);
(Continued)

(58) Field of Classification Search
None
See application file for complete search history.

(56) References Cited

U.S. PATENT DOCUMENTS 5,278,926 A   1/1994   Doussiere
6,310,995 B1  10/2001  Saini et al.
(Continued)

FOREIGN PATENT DOCUMENTS

CN   2689539 Y    3/2005
JP   5-243679     9/1993
(Continued)

OTHER PUBLICATIONS

Written Opinion dated Mar. 27, 2018 in PCT/JP2017/045459 filed Dec. 19, 2017.
(Continued)

*Primary Examiner* — Michelle R Connelly
(74) *Attorney, Agent, or Firm* — Oblon, McClelland, Maier & Neustadt, L.L.P.

(57) ABSTRACT

An optical integrated device includes a substrate a passive waveguide region and an active region. The active region and the passive waveguide region include a first mesa structure having an upper cladding portion formed of a same material as the upper cladding layer. The passive waveguide region includes a second spot size converter having the first mesa structure, a second mesa structure having a first core portion, a lower cladding portion, and a second core portion that are formed of same materials as the first core layer, the lower cladding layer, and the second core layer, respectively. The second mesa structure has a width wider than a width of the first mesa structure, and the width of the first mesa structure continuously changes along a longitudinal direc-
(Continued)

tion in which light is guided through the second core portion, the width being along a direction perpendicular to the longitudinal direction.

22 Claims, 12 Drawing Sheets

(51) Int. Cl.
    *G02B 6/12* (2006.01)
    *H01S 5/026* (2006.01)
    *G02B 6/30* (2006.01)
    *G02B 6/27* (2006.01)
    *H01S 5/10* (2021.01)

(52) U.S. Cl.
    CPC .............. *G02B 6/305* (2013.01); *H01S 5/026* (2013.01); *G02B 6/2726* (2013.01); *H01S 5/1014* (2013.01)

(56) References Cited

U.S. PATENT DOCUMENTS

| | | | |
|---|---|---|---|
| 6,600,847 B2 | 7/2003 | Saini et al. | |
| 7,359,588 B2 | 4/2008 | Kang et al. | |
| 8,457,169 B2 | 6/2013 | Kimoto et al. | |
| 2005/0094924 A1* | 5/2005 | Forrest | G02B 6/12004 385/14 |
| 2015/0260915 A1* | 9/2015 | Kitamura | G02B 6/1228 385/131 |

FOREIGN PATENT DOCUMENTS

| | | |
|---|---|---|
| JP | 6-174982 A | 6/1994 |
| JP | 7-120795 | 5/1995 |
| JP | 10-98231 A | 4/1998 |
| JP | 2009-117539 A | 5/2009 |
| JP | 2016-126216 | 7/2016 |

OTHER PUBLICATIONS

Xiao-Jian, K.. et al., "Analysis of principles of tapered-rib waveguide SOAs", Journal of Naval University of Engineering, vol. 14, No. 3, Jun. 2002, pp. 29-32 (with English abstract).

Combined Chinese Office Action and Search Report dated Sep. 3, 2020 in corresponding Chinese Patent Application No. 201780078544.1 (with English Translation and English Translation of Category of Cited Documents), 12 pages.

N. Yoshimoto et al., "Spot-Size Converted Polarization-Insensitive SOA Gate with a Vertical Tapered Submicrometer Stripe Structure", IEEE Photonics Technology Letters, vol. 10, No. 4, Apr. 1998, pp. 510-512.

* cited by examiner

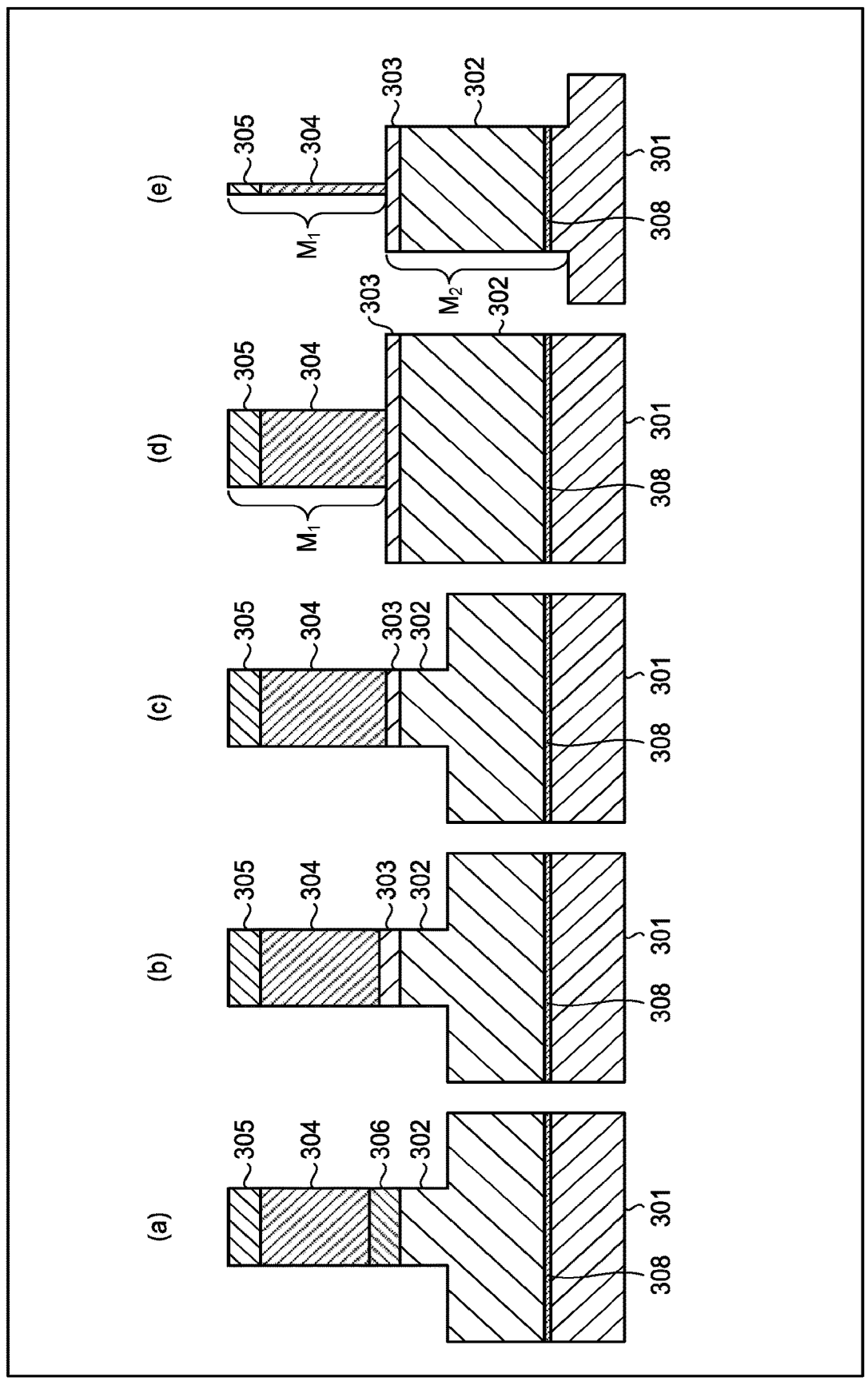

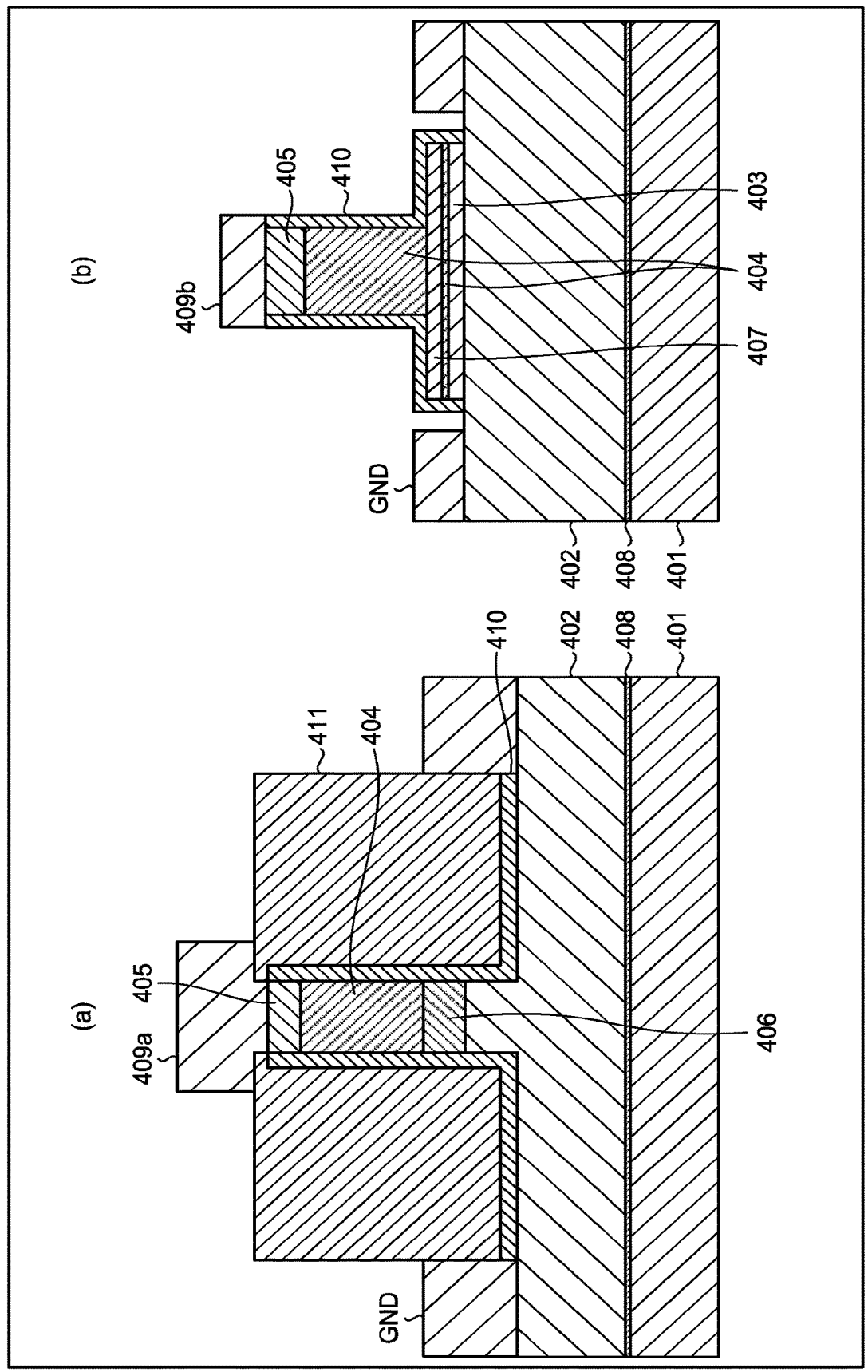

OPTICAL INTEGRATED DEVICE AND OPTICAL TRANSMITTER MODULE

CROSS-REFERENCE TO RELATED APPLICATION(S)

This application is a continuation of International Application No. PCT/JP2017/045459, filed on Dec. 19, 2017 which claims the benefit of priority of the prior Japanese Patent Application No. 2016-245616, filed on Dec. 19, 2016, the entire contents of which are incorporated herein by reference.

BACKGROUND

The present disclosure relates to an optical integrated device and an optical transmitter module.

Due to the recent demand for downsizing of optical communication devices, the level of demand for an optical integrated device is also increasing, the optical integrated device having optical elements with different functions, such as a semiconductor optical amplifier and a phase modulator, which are integrated onto the same substrate (see, for example, Japanese Laid-open Patent Publication No. 2016-126216).

However, when elements, such as a semiconductor optical amplifier and a phase modulator, are integrated onto the same substrate, thicknesses of their waveguide layers are preferably optimized according to properties of these elements, respectively. For example, for reducing the electric capacity and increasing the speed of response in the phase modulator, the thickness of its waveguide layer is preferably made thick, while for keeping the decrease in saturation output small in the semiconductor optical amplifier, the thickness of its waveguide layer is preferably made equal to or less than a certain thickness.

When the thicknesses of the waveguide layers of the integrated elements are optimized as described above, the difference between the optimum thicknesses of these waveguide layers is increased, thus creating a problem that the connection loss is increased at a joint between these elements. FIG. 8 is a graph illustrating an example of connection loss in waveguide layers having different thicknesses. As illustrated in FIG. 8, as a ratio of a thickness of one end of one waveguide layer to a thickness of one end of the other waveguide layer that is connected to the one end of the one waveguide layer is connected is away from 1, the connection loss is increased. Furthermore, when discontinuity in a refractive index occurs at the joint, reflection also occurs at the joint; and as a ratio between the thicknesses of the waveguide layers at the joint is away from 1, the reflection becomes greater and properties of the optical integrated device are adversely influenced to a greater degree.

Furthermore, optimization of the thickness of a waveguide layer of each element integrated into an optical integrated device influences tolerance of the optical integrated device to a peripheral optical device. That is, light output from or entering the optical integrated device will be coupled to an optical fiber or a light source; and since a spot size optimized for the waveguide layer of each element integrated therein will largely differ from a spot size optimized for the optical fiber or light source, tolerance of a coupling lens between the optical integrated device and the peripheral optical device will be reduced.

SUMMARY

According to a first aspect of the present disclosure, an optical integrated device is provided which includes a substrate; a passive waveguide region including: an upper cladding layer; a lower cladding layer; a first core layer arranged between the upper cladding layer and the lower cladding layer, the first core layer having a higher refractive index than the upper cladding layer and the lower cladding layer; and a second core layer arranged between the lower cladding layer and the substrate, the second core layer having a higher refractive index than the lower cladding layer and the substrate; an active region including: the upper cladding layer; the lower cladding layer; the first core layer; the second core layer; and a quantum well layer arranged within a range of a mode field of light guided through the first core layer, the quantum well layer being configured to amplify light with electric current injected thereto. The active region and at least a part of the passive waveguide region have a first mesa structure having an upper cladding portion formed of a same material as the upper cladding layer, the first mesa structure protruding in a mesa shape from the first core layer. The passive waveguide region includes a second spot size conversion region having, in addition to the first mesa structure, a second mesa structure having a first core portion, a lower cladding portion, and a second core portion that are formed of same materials as the first core layer, the lower cladding layer, and the second core layer, respectively, the second mesa structure protruding in a mesa shape from the substrate. The second mesa structure has a width wider than a width of the first mesa structure, and the width of the first mesa structure continuously changes along a longitudinal direction in which light is guided through the second core portion in the passive waveguide region having the second mesa structure, the width being along a direction perpendicular to the longitudinal direction.

According to a second aspect of the present disclosure, an optical integrated device is provided which includes a substrate; a passive waveguide region where a lower cladding layer, a first core layer having a refractive index higher than that of the lower cladding layer, and an upper cladding layer having a refractive index lower than that of the first core layer have been sequentially layered on the substrate; and an active region where the lower cladding layer, the first core layer, a quantum well layer that amplifies light by electric current being injected into the quantum well layer, and the upper cladding layer have been sequentially layered on the substrate. The first core layer and the quantum well layer are close to each other in a range of a mode field of light guided through the first core layer. The passive waveguide region includes a first spot size conversion region where the first core layer changes in layer thickness.

According to a second aspect of the present disclosure, an optical integrated device is provided which includes a substrate; a passive waveguide region including: an upper cladding layer; a lower cladding layer; a first core layer arranged between the upper cladding layer and the lower cladding layer, the first core layer having a higher refractive index than the upper cladding layer and the lower cladding layer. At least a part of the passive waveguide region has a first mesa structure having an upper cladding portion formed of a same material as the upper cladding layer, the first mesa structure protruding in a mesa shape from the first core layer. The passive waveguide region includes, in addition to the first mesa structure, a first spot size conversion region where the first core layer changes in layer thickness, and a second spot size conversion region having a second mesa structure having a first core portion, a lower cladding portion, and a second core portion that are formed of same materials as the first core layer, the lower cladding layer, and the second core layer, respectively, the second mesa structure protruding in a mesa shape from the substrate. The second mesa structure has a width wider than a width of the first mesa structure, and the width of the first mesa structure continuously changes along a longitudinal direction in which light is guided through the second core portion in the passive waveguide region having the second mesa structure, the width being along a direction perpendicular to the longitudinal direction.

The above and other objects, features, advantages and technical and industrial significance of this disclosure will be better understood by reading the following detailed description of presently preferred embodiments of the disclosure, when considered in connection with the accompanying drawings.

BRIEF DESCRIPTION OF THE DRAWINGS

FIG. 3C is sectional views of the optical integrated device according to the third embodiment;

FIG. 6 is sectional views illustrating examples of formation of a passivation film and electrodes;

DETAILED DESCRIPTION

Hereinafter, while reference is made to the drawings, optical integrated devices according to embodiments of the present disclosure will be described in detail. The present disclosure is not limited by the embodiments described below. Furthermore, throughout the drawings, any components that are the same or corresponding to one another will be assigned with the same reference sign as appropriate. Moreover, it should be noted that the drawings are schematic, and that thicknesses of layers and thickness ratios among the layers may be different from the actual ones. In addition, a portion having dimensional relations and ratios different from one another among the drawings may be included.

First Embodiment

Figure 1A:
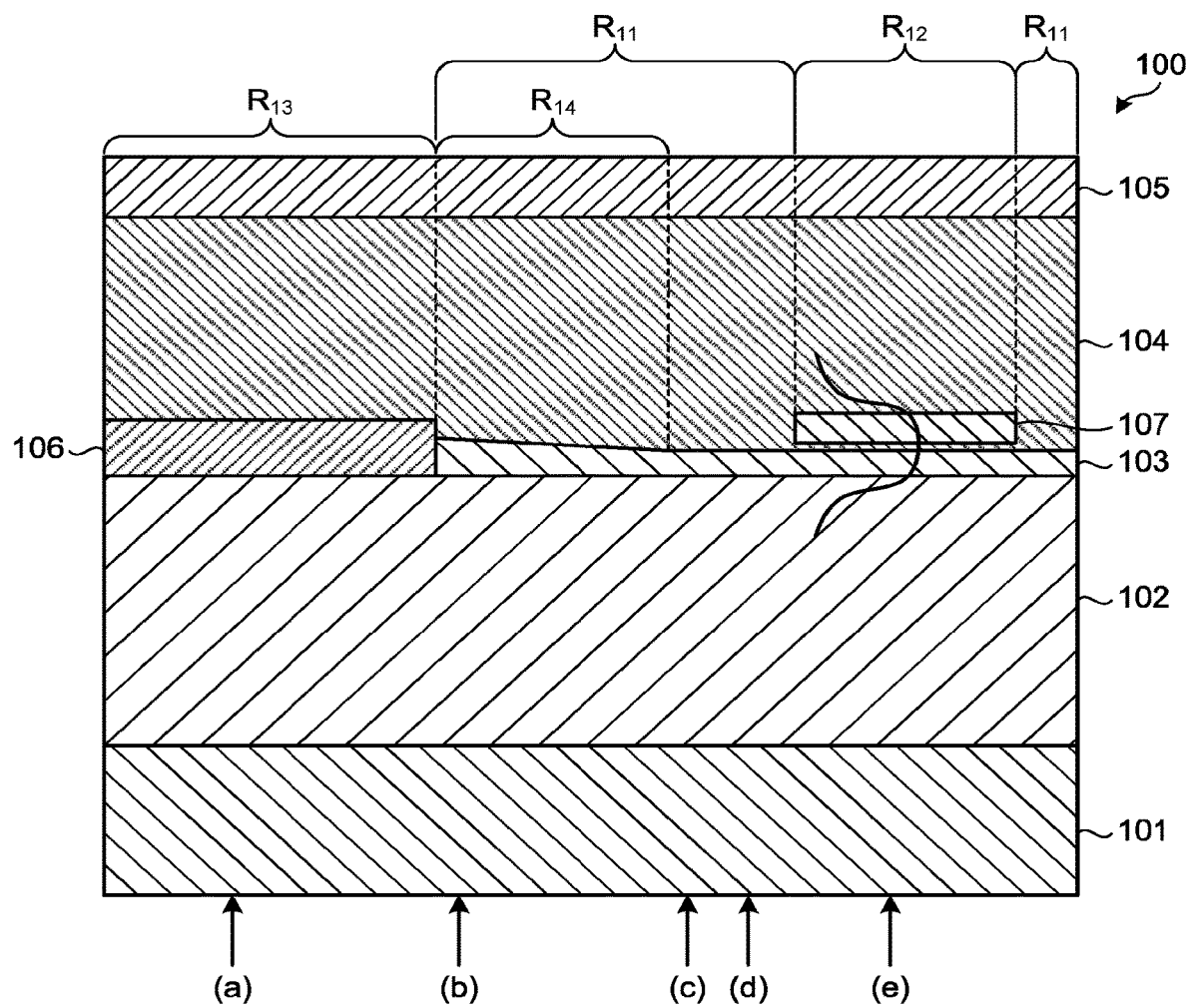
FIG. 1A is a sectional view of an optical integrated device along a waveguide direction, according to a first embodiment.
Figure 1B:
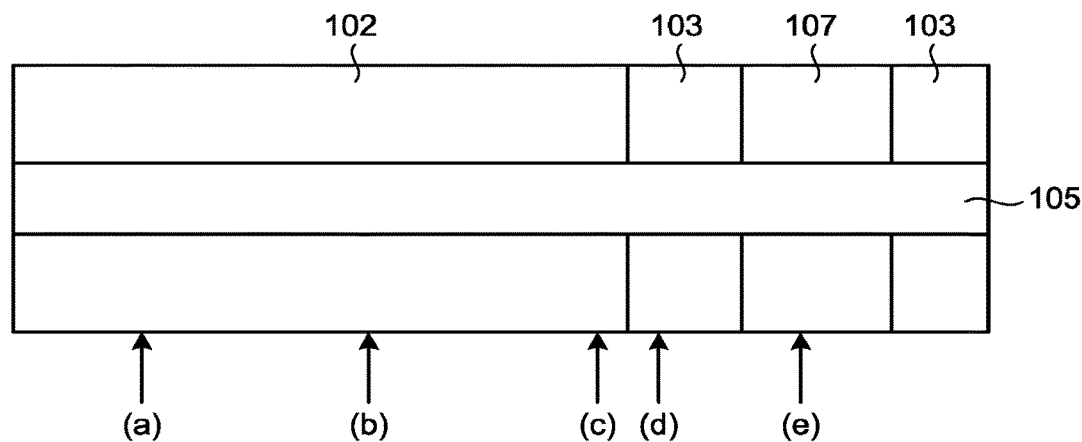
FIG. 1B is a top view of the optical integrated device according to the first embodiment.
Figure 1C:
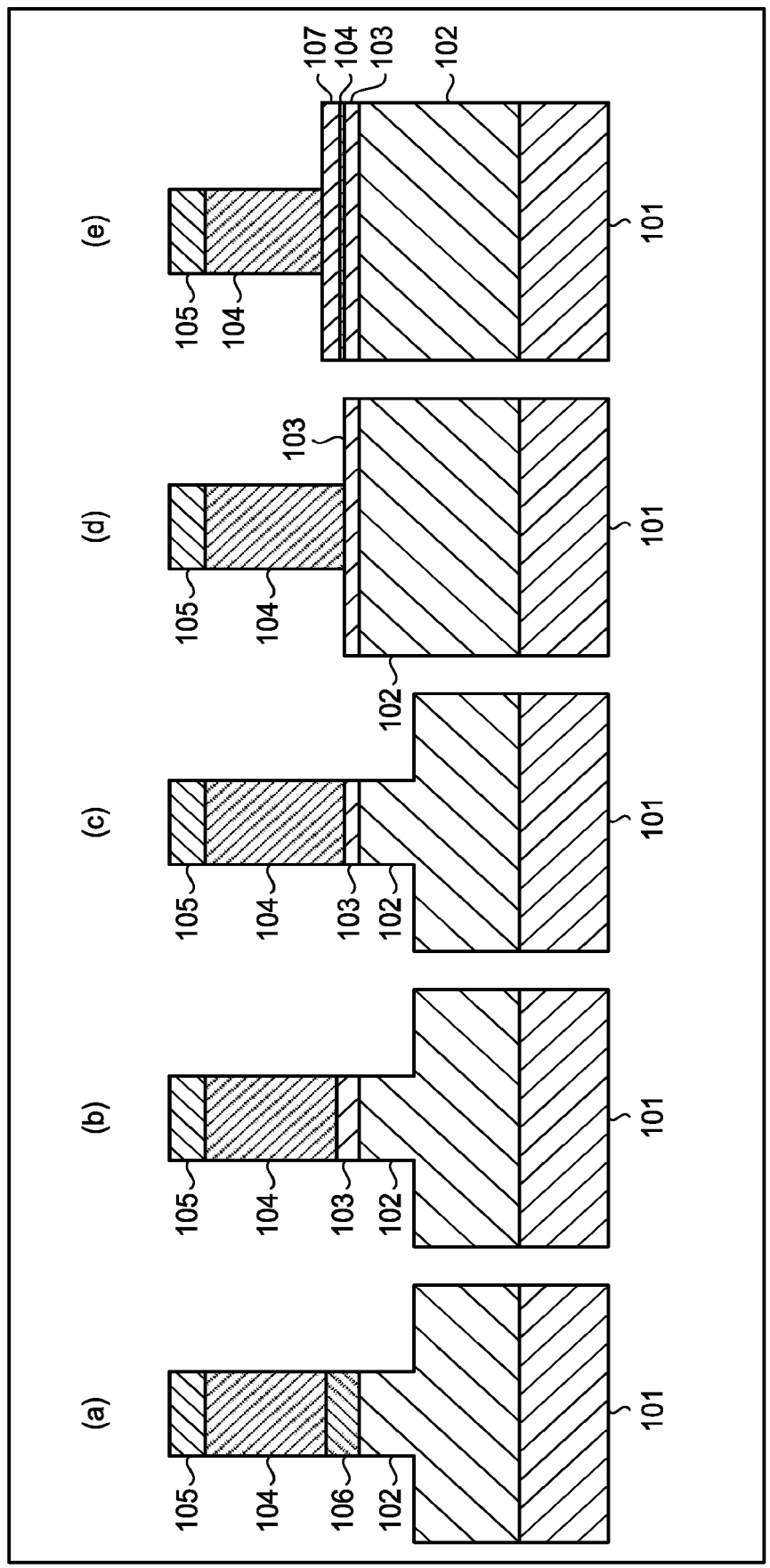
FIG. 1C is sectional views of the optical integrated device according to the first embodiment.

FIG. 1A is a sectional view of an optical integrated device along a waveguide direction, according to a first embodiment; FIG. 1B is a top view of the optical integrated device according to the first embodiment; and FIG. 1C is sectional views of the optical integrated device according to the first embodiment. Arrows (a) to (e) illustrated in FIG. 1A and FIG. 1B correspond to locations of cross sections illustrated in FIG. 1C.

An optical integrated device 100 illustrated in FIG. 1A to FIG. 1C will be described as an example of a configuration used in a joint region from a phase modulator to a semiconductor optical amplifier (SOA). However, the optical integrated device according to the first embodiment is not limited to this combination with the phase modulator. A particularly preferable effect is able to be obtained in a combination with a device having a thick core layer, the device not necessarily being a phase modulator. Here, a Mach-Zehnder modulator is used as an example of the phase modulator. Furthermore, the optical integrated device 100 may be used when light of a 1.55 μm wavelength band is incident on any of left and right facets in FIG. 1A or FIG. 1B.

As illustrated in FIG. 1A, the optical integrated device 100 includes: a passive waveguide region $R_{11}$ where a lower cladding layer 102, a waveguide core 103, an upper cladding layer 104, and a contact layer 105 have been sequentially layered on a substrate 101; and an active region $R_{12}$ where the lower cladding layer 102, the waveguide core 103, a quantum well layer 107, the upper cladding layer 104, and the contact layer 105 have been sequentially layered on the substrate 101. Furthermore, the optical integrated device 100 includes, as an example of a configuration having a phase modulator integrated into the same device: a modulator region $R_{13}$ where the lower cladding layer 102, a modulator core 106, the upper cladding layer 104, and the contact layer 105 have been sequentially layered on the substrate 101.

Specifically, the optical integrated device 100 has the lower cladding layer 102 layered on the substrate 101. For example, the substrate 101 is an InP substrate; and the lower cladding layer 102 is n-doped InP, and has a layer thickness of 1500 nm.

Furthermore, the optical integrated device 100 has the modulator core 106 and the waveguide core 103 that are formed on the lower cladding layer 102, and the modulator core 106 and the waveguide core 103 are connected to each other. For example, the modulator core 106 is formed of an AlGaInAs multiple quantum well, and has a layer thickness of 500 nm.

For example, the waveguide core 103 is formed of GaInAsP having a refractive index of 3.39, and is formed to have a refractive index higher than those of the lower cladding layer 102 and the upper cladding layer 104. That is, light guided through the waveguide core 103 is confined therein due to the difference between refractive indexes of the lower cladding layer 102 and the upper cladding layer 104.

The passive waveguide region $R_{11}$ includes a spot size conversion region $R_{14}$ where the waveguide core layer changes in layer thickness, over a range from a portion thereof (around (b) in FIG. 1A and FIG. 1B) connected to the modulator core 106 to a predetermined location (around (c) in in FIG. 1A and FIG. 1B). The waveguide core 103 in the spot size conversion region $R_{14}$ has a layer thickness of 400 nm at the portion connected to the modulator core 106, and becomes thinner to 200 nm therefrom. The confinement of the light is also changed by the change in the layer thickness of the waveguide core 103 in the spot size conversion region $R_{14}$, and a mode field diameter of the light guided through the waveguide core 103 is also converted. Furthermore, the spot size conversion region $R_{14}$ is arranged between the active region $R_{12}$ and the modulator region $R_{13}$.

Furthermore, as illustrated in FIG. 1A, the quantum well layer 107 is provided near the waveguide core 103 in the active region $R_{12}$. Being near the waveguide core 103 means being near the waveguide core 103 in a range of a mode field of light guided through the waveguide core 103. A layer (an intermediate layer) is interposed between the waveguide core 103 and the quantum well layer 107. The intermediate layer is made of a material having a composition different from those of the waveguide core 103 and the quantum well layer 107 and having the same composition as the upper cladding layer 104. Additionally, the intermediate layer may be made of a material having the same composition as the lower cladding layer 102. A curve illustrated in FIG. 1A visually exemplifies the mode field of light guided through the waveguide core 103.

The quantum well layer 107, for example, is formed of a GaInAsP multiple quantum well, and has a layer thickness of 100 nm. This quantum well layer 107 functions as an active layer of the SOA. That is, the mode field of light guided through the waveguide core 103 extends to the quantum well layer 107, and thus when electric current is injected from an electrode not illustrated in the figures (FIG. 6 illustrating an example thereof), the amplification effect thereof (for example, a gain of about 10 dB) will be exerted on the optical power of the light guided through the waveguide core 103. Such a configuration having the quantum well layer 107 above the waveguide core 103 with an interval therebetween is sometimes called an offset quantum well; and because the active layer of the SOA is able to be made just by layering the material of the quantum well layer 107 above and near the waveguide core 103 and removing the quantum well layer 107 by etching in the regions other than the active region $R_{12}$, the configuration is advantageous in that there is no need for additional crystal growth and etching.

The upper cladding layer 104 is layered on the modulator core 106, the waveguide core 103, and the quantum well layer 107. For example, the upper cladding layer 104 is p-doped InP, and has a layer thickness of 2 Furthermore, the contact layer 105 is layered on the upper cladding layer 104. For example, the contact layer 105 is p-doped InGaAs, and has a layer thickness of 500 nm.

The optical integrated device 100 is a waveguide having a so-called mesa structure that differs from region to region in the optical integrated device 100. Accordingly, the mesa structures in the different regions of the optical integrated device 100 are described below with reference to FIG. 1A to FIG. 1C.

As illustrated in FIG. 1B and FIG. 1C, a width of the mesa structure in the optical integrated device 100 is constant, and is, for example, 2.0 μm. Although the width of the mesa structure in the optical integrated device 100 is constant in this embodiment, a difference may be provided between widths of the mesa structure in the different regions as necessary in other embodiments.

As illustrated in FIG. 1C(a), a high mesa structure is formed in the phase modulator region in the optical integrated device 100. The high mesa structure protrudes in a mesa shape from a part of the lower cladding layer 102 through to an upper surface of the contact layer 105. Therefore, as illustrated in FIG. 1B, in the top view of the phase modulator region of the optical integrated device 100, the lower cladding layer 102 appears on both sides of the mesa structure.

As illustrated in FIG. 1C(b) and FIG. 1C(c), a high mesa structure is formed in a partial region (the above described spot size converter region) of the waveguide core 103 in the optical integrated device 100. The high mesa structure protrudes in a mesa shape from a part of the lower cladding layer 102 through to the upper surface of the contact layer 105 through the waveguide core 103. However, as understood by comparing FIG. 1C(b) and FIG. 1C(c), the waveguide core 103 has different layer thicknesses therein. This is to make the partial region of the waveguide core 103, which corresponds to the spot size c conversion region $R_{14}$, to function to convert the spot size, as described above. Furthermore, as illustrated in FIG. 1B, in the top view of the partial region (the region from (b) to (c)) of the waveguide core 103, the lower cladding layer 102 appears on both sides of the mesa structure. According to this example, the high mesa structure is adopted in the partial region of the waveguide core 103, but a low mesa structure (see FIG. 1C(d) described later) may also be adopted in that partial region.

As illustrated in FIG. 1C(d), a low mesa structure is formed in another partial region (a region other than the above described spot size converter region) of the waveguide core 103 in the optical integrated device 100. The low mesa structure protrudes in a mesa shape from an upper surface of the waveguide core 103 through to the upper surface of the contact layer 105. This lower mesa structure is connected to the high mesa structure described above between the spot size conversion region R14 and the active region $R_{12}$ in the optical integrated device 100. Since the high mesa structure and the low mesa structure generally differ from each other in their properties related to confinement of light, loss is generated when a waveguide in a high mesa structure and a waveguide in a low mesa structure are connected to each other. Thus, as described in, for example, Japanese Unexamined Patent Application, Publication No. 2014-035540, an intermediate region may be provided between the high mesa structure and the low mesa structure such that confinement of light is realized also in the intermediate region. With this, loss in optical connection between the waveguide in the high mesa structure and the waveguide in the low mesa structure is able to be reduced. Furthermore, while the waveguide core 103 appears on both sides of the mesa structure in the top view of the partial region (the region of (d)) of the optical integrated device 100, as illustrated in FIG. 1B, the upper cladding layer 104 may appear on the surface on both sides of the mesa structure instead.

As illustrated in FIG. 1C(e), a low mesa structure is formed in the active region $R_{12}$ of the optical integrated device 100. The low mesa structure protrudes in a mesa shape from an upper surface of the quantum well layer 107 through to the upper surface of the contact layer 105. Therefore, as illustrated in FIG. 1B, in the top view of the region (the region of (e)) where the quantum well layer 107 is provided on the waveguide core 103, the quantum well layer 107 appears on both sides of the mesa structure. The upper cladding layer 104 may appear on the surface on both sides of the mesa structure instead.

With reference to FIG. 1A, a configuration of the optical integrated device 100 will be described in terms of a manufacturing method thereof.

In a method of manufacturing the optical integrated device 100, n-InP serving as the lower cladding layer 102, an AlGaInAs multiple quantum well layer serving as the modulator core 106, and p-InP that is a part of the upper cladding layer 104 are sequentially formed on an InP substrate serving as the substrate 101, by use of a metal organic chemical vapor deposition (MOCVD) method.

Subsequently, after a silicon nitride (SiNx) film is deposited on the entire surface of the p-InP layer that is the part of the upper cladding layer 104, the SiNx film is patterned into a pattern slightly wider than the phase modulator. Then, the layers up to the AlGaInAs multiple quantum well layer are etched away with the patterned SiNx film used as a mask, and the n-InP layer serving as the lower cladding layer 102 is exposed.

Subsequently, by using the SiNx film as a mask for selective growth, GaInAsP serving as the waveguide core 103, p-InP serving as the intermediate layer between the waveguide core 103 and the quantum well layer 107, a GaInAsP multiple quantum well serving as the quantum well layer 107, and p-InP serving as the upper cladding layer 104 are sequentially layered thereon, by the MOCVD method. Upon this layering, film thicknesses of the flat region and the selective growth region are adjusted to be in a ratio of about 1:2.

Subsequently, the SiNx film is removed once, and a new SiNx film is formed on the entire surface. Then, the new SiNx film is patterned such that a region not serving as the phase modulator or the SOA is made open. With this SiNx film serving as a mask, the p-InP layer and the GaInAsP multiple quantum well layer are etched away. Thereafter, after removing the SiNx film, p-InP that is a part of the upper cladding layer 104 and p-InGaAs serving as the contact layer 105 are layered thereon by the MOCVD method.

Subsequently, a SiNx film is formed on the entire surface again; patterning and etching for a low mesa structure are performed; after the SiNx film is removed once, a SiNx film is formed on the entire surface; and patterning and etching for a high mesa structure are performed.

Thereafter, by known methods, a passivation film, a resin layer and its opening, and electrodes for electric current injection and voltage application are formed in respective portions. After processing of the surface is finished, the substrate is thinned so as to have a desired thickness, and an electrode is formed on the underside if required. Facets are formed by cleavage of the substrate, facet coating and element isolation are performed, and the optical integrated device 100 is completed.

As described above, according to the configuration of the optical integrated device 100, by performing crystal growth three times and mesa structure formation twice, the phase modulator, the SOA, and the spot size converter are able to be integrated into a single device.

In the above described optical integrated device 100 according to the first embodiment, even if an element having a thick waveguide layer like a phase modulator and an element having a thin waveguide layer like an SOA are integrated into a single device, the spot size is able to be converted by a spot size converter arranged between the phase modulator and the SOA, and thus optimum configurations are able to be adopted for both the phase modulator and the SOA.

Second Embodiment

Figure 2A:
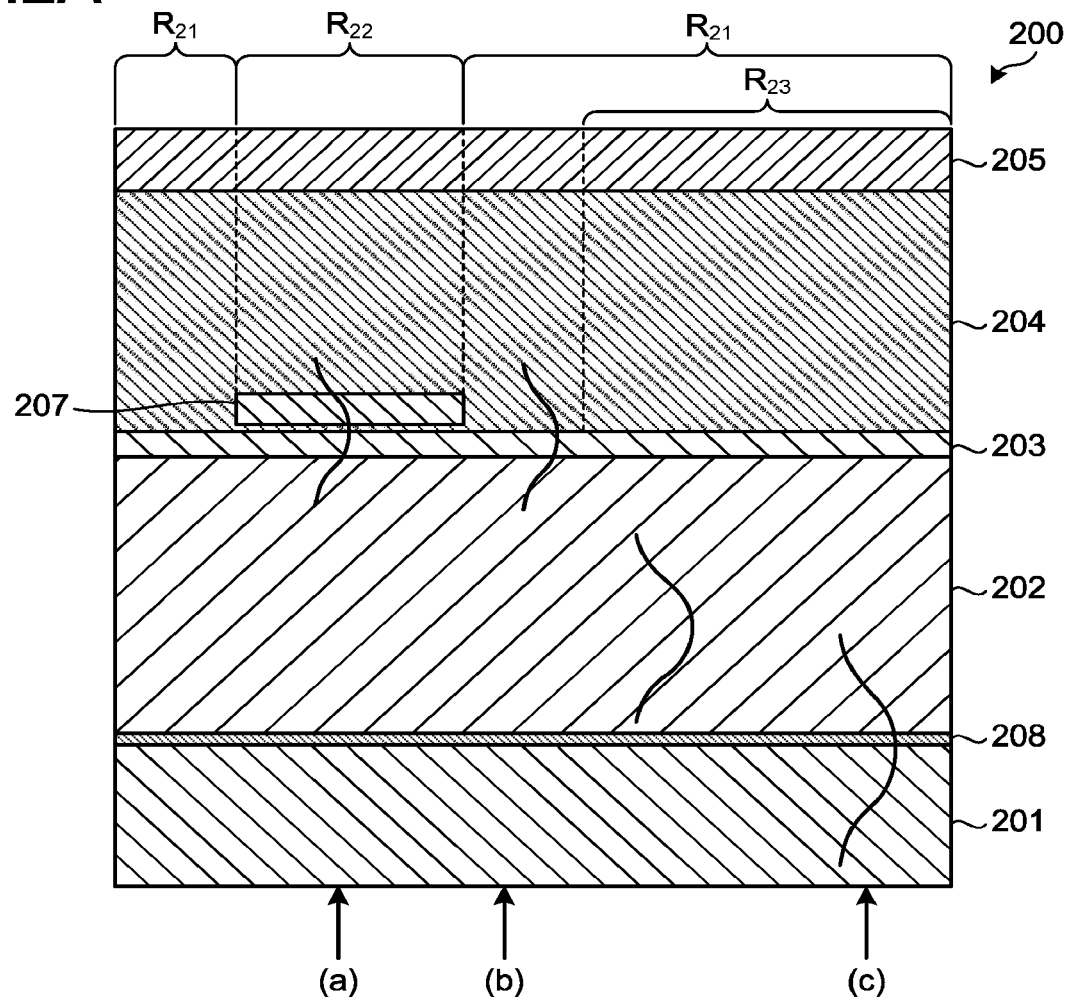
FIG. 2A is a sectional view of an optical integrated device along a waveguide direction, according to a second embodiment.
Figure 2B:
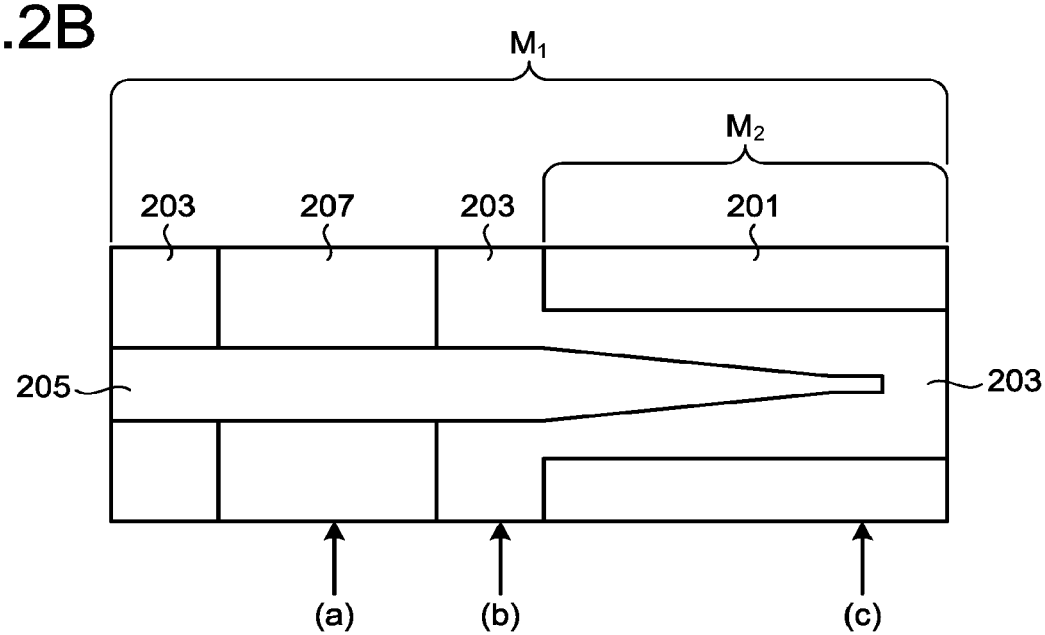
FIG. 2B is a top view of the optical integrated device according to the second embodiment.
Figure 2C:
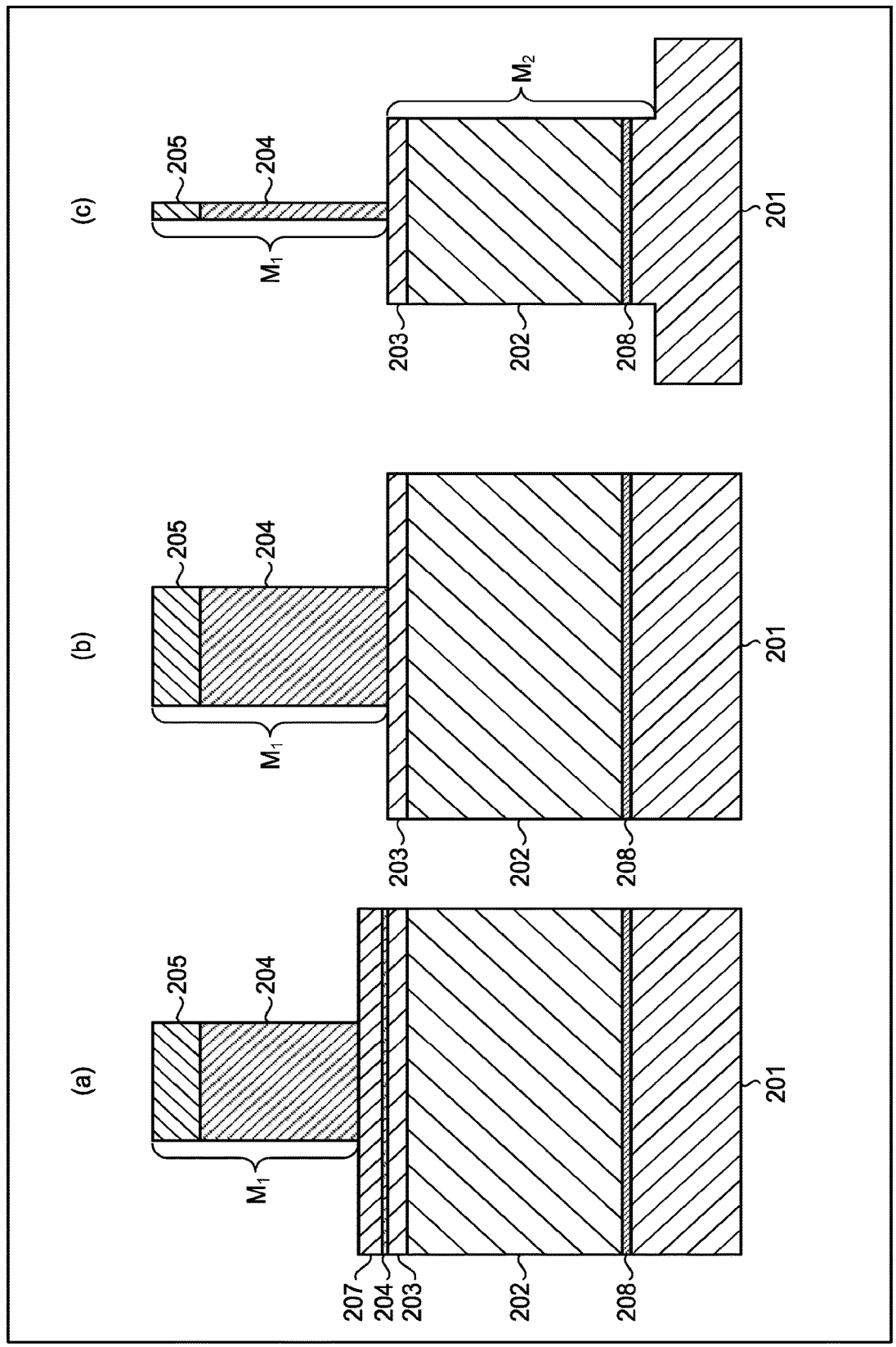
FIG. 2C is sectional views of the optical integrated device according to the second embodiment.

FIG. 2A is a sectional view of an optical integrated device along a waveguide direction, according to a second embodiment; FIG. 2B is a top view of the optical integrated device according to the second embodiment; and FIG. 2C is sectional views of the optical integrated device according to the second embodiment. Arrows (a) to (c) illustrated in FIG. 2A and FIG. 2B correspond to locations of cross sections illustrated in FIG. 2C. Furthermore, the optical integrated device according to the second embodiment is also applicable to a use where light of a 1.55 µm wavelength band is incident on any of left and right facets in FIG. 2A or FIG. 2B.

As illustrated in FIG. 2A, an optical integrated device 200 includes: a passive waveguide region $R_{21}$ where a spot size converter (SSC) core 208, a lower cladding layer 202, a waveguide core 203, an upper cladding layer 204, and a contact layer 205 have been sequentially layered on a substrate 201; and an active region $R_{22}$ where the SSC core 208, the lower cladding layer 202, the waveguide core 203, a quantum well layer 207, the upper cladding layer 204, and the contact layer 205 have been sequentially layered on the substrate 201. Furthermore, the passive waveguide region $R_{21}$ includes, as illustrated in FIG. 2B and FIG. 2C described later, a spot size conversion region $R_{23}$ having a two-stage mesa structure.

Specifically, the optical integrated device 200 has the SSC core 208 layered on the substrate 201. For example, the substrate 201 is an InP substrate. The SSC core 208 is a core for spot size conversion and formed of, for example, GaInAsP having a refractive index of 3.34. The SSC core 208 may have a layer thickness of 100 nm. Instead of directly layering the SSC core 208 on the substrate 201, another InP layer may be layered on the substrate 201 and the SSC core 208 may be layered thereon.

For example, the lower cladding layer 202 is n-doped InP, and has a layer thickness of 1500 nm. Furthermore, the waveguide core 203 is formed on the lower cladding layer 202. For example, the waveguide core 203 is formed of GaInAsP having a refractive index of 3.39, which is higher than those of the lower cladding layer 202 and the upper cladding layer 204.

Furthermore, as illustrated in FIG. 2A, the quantum well layer 207 is provided near the waveguide core 203 in the active region $R_{22}$. Being near the waveguide core 203 means being near the waveguide core 203 in a range of the mode field of light guided through the waveguide core 203. A layer (an intermediate layer) is interposed between the waveguide core 203 and the quantum well layer 207. The intermediate layer is made of a material having a composition different from those of the waveguide core 203 and the quantum well layer 207 and having the same composition as the upper cladding layer 204. Additionally, the intermediate layer may be made of a material having the same composition as the lower cladding layer 202. The quantum well layer 207, for example, is formed of a GaInAsP multiple quantum well, and has a layer thickness of 100 nm. A configuration of this quantum well layer 207 is similar to that of the first embodiment, and the quantum well layer 207 functions as an active layer of an SOA.

The waveguide core 203 has the upper cladding layer 204 layered thereon. For example, the upper cladding layer 204 is p-doped InP, and has a layer thickness of 2 µm. Furthermore, the upper cladding layer 204 has the contact layer 205 layered thereon. For example, the contact layer 205 is p-doped InGaAs, and has a layer thickness of 500 nm.

This optical integrated device 200 is a waveguide having a so-called mesa structure that differs from region to region in the optical integrated device 200. Accordingly, described below by parallel reference to FIG. 2A to FIG. 2C are the mesa structure in the different regions of the optical integrated device 200.

As illustrated in FIG. 2B and FIG. 2C, the optical integrated device 200 includes substantially two types of mesa structures. That is, the optical integrated device 200 has: in the passive waveguide region $R_{21}$ and the active region $R_{22}$, a first mesa structure $M_1$ where the contact layer 205 and upper cladding layer 204 protrude in a mesa shape; and in a part of the passive waveguide region $R_{21}$, in addition to the first mesa structure $M_1$, a second mesa structure $M_2$ where the waveguide core 203, the lower cladding layer 202, the SSC core 208, and a part of the substrate 201 protrude in a mesa shape. This part of the passive waveguide region $R_{21}$, the part having the first mesa structure $M_1$ and the second mesa structure $M_2$, functions as a spot size converter as described later. Furthermore, this part of the passive waveguide region $R_{21}$, the part having the first mesa structure $M_1$ and the second mesa structure $M_2$, is arranged adjacently to a facet of the optical integrated device 200. In FIG. 2B, in the region where the waveguide core 203 and the quantum well layer 207 appear on the surface, the upper cladding layer 204 may appear on the surface instead.

As illustrated in FIG. 2C(a) and FIG. 2C(b), in the region where the second mesa structure $M_2$ is not formed, the width of the first mesa structure $M_1$ is constant and is, for example, 2.0 μm. On the contrary, as illustrated in FIG. 2C(c), in the region where the second mesa structure $M_1$ is formed, the width of the first mesa structure $M_1$ continuously decreases toward the facet. As illustrated in FIG. 2B, the width of the first mesa structure $M_1$ is preferably constant, for example, 0.5 μm, at a trailing end portion thereof, and is preferably structured to come to an end (such that the width becomes zero) on the way or without being extended to the facet of the optical integrated device 200. This is to obtain an effect of reducing variation in spot size conversion.

Described below are reasons why the above described configuration reduces the variation in spot size conversion. In the optical integrated device 200 having the above described configuration, as illustrated in FIG. 2A, as the width of the first mesa structure $M_1$ becomes narrower, the mode field of light guided through the waveguide core 203 is adiabatically shifted to the SSC core 208. Curves illustrated in FIG. 2A visually exemplify the mode field of light shifting from the waveguide core 203 to the SSC core 208.

The mode field of light shifting from the waveguide core 203 to the SSC core 208 receives the effect of being shifted upward by the first mesa structure $M_1$, and the magnitude of this effect of shifting the mode field of light upward is determined by the width of the first mesa structure $M_1$. That is, the vertical size of the mode field of light is sensitive to the precision of the width of the first mesa structure $M_1$. Therefore, when the first mesa structure $M_1$ is structured to come to an end in the middle without being extended to the facet of the optical integrated device 200, a thin mesa structure susceptible to the width direction precision is not made, and the effect of reducing the variation in spot size conversion is thus able to be achieved.

Described below by reference to FIG. 2A is a configuration of the optical integrated device 200 in terms of a manufacturing method thereof.

In a method of manufacturing the optical integrated device 200, firstly, by using the metal organic chemical vapor deposition (MOCVD) method, GaInAsP serving as the SSC core 208, n-InP serving as the lower cladding layer 202, GaInAsP serving as the waveguide core 203, p-InP serving as a buffer layer between the waveguide core 203 and the quantum well layer 207, a GaInAsP multiple quantum well serving as the quantum well layer 207, and p-InP serving as the upper cladding layer 204 are sequentially formed on an InP substrate serving as the substrate 201.

Subsequently, after depositing a SiNx film on the entire surface of the p-InP layer that is a part of the upper cladding layer 204, patterning is performed such that the passive waveguide region $R_{21}$ that is not the SOA is made open. With this SiNx film serving as a mask, the p-InP layer and the GaInAsP multiple quantum well layer are etched away. Thereafter, after removing the SiNx film, p-InP that is a part of the upper cladding layer 204 and p-InGaAs serving as the contact layer 205 are layered thereon by the MOCVD method.

Subsequently, a SiNx film is formed on the entire surface again; patterning and etching for the first mesa structure $M_1$ are performed; after the SiNx film is removed once, a SiNx film is formed on the entire surface; and patterning and etching for the second mesa structure $M_2$ are performed.

Thereafter, by known methods, a passivation film, a resin layer and its opening, and electrodes for electric current injection and voltage application are formed in respective portions. After processing of the surface is finished, the substrate is polished so as to have a desired thickness, and an electrode is formed on the underside if required. Furthermore, facets are formed by cleavage of the substrate, facet coating and element isolation are performed, and the optical integrated device 200 is completed.

Due to the above described structure, the optical integrated device 200 enables an SOA and a spot size converter to be integrated into a single device, and the spot size converter is able to widen the spot size from a little less than 1 μm to about 3 μm, the spot size being measured as the full width at $1/e^2$.

Furthermore, as described above, since an SOA and a spot size converter are able to be integrated into a single device by performing crystal growth twice and mesa structure formation twice, the optical integrated device 200 is able to be manufactured easily. The above described optical integrated device 200 includes the two-stage mesa structure having the first mesa structure $M_1$ and the second mesa structure $M_2$, but increasing the number of stages in this mesa structure does not cause deviation from the gist of the present disclosure.

Even if an element having a thick waveguide layer like the phase modulator is integrated into the above described optical integrated device 200 according to the second embodiment, tolerance to an optical element peripheral to the optical integrated device 200 is able to be improved by the spot size converter arranged adjacently to the facet of the optical integrated device 200. Furthermore, since the quantum well layer 207 in the active region $R_{22}$ of the optical integrated device 200 is arranged near the waveguide core 203, absorption of light guided through the waveguide core 203 by the quantum well layer 207 is able to be reduced. Furthermore, since the spot size converter and the quantum well layer 207 serving as the active layer of the SOA are able to be designed independently from each other, the spot size converter and the SOA are able to be optimized individually.

Third Embodiment

Figure 3A:
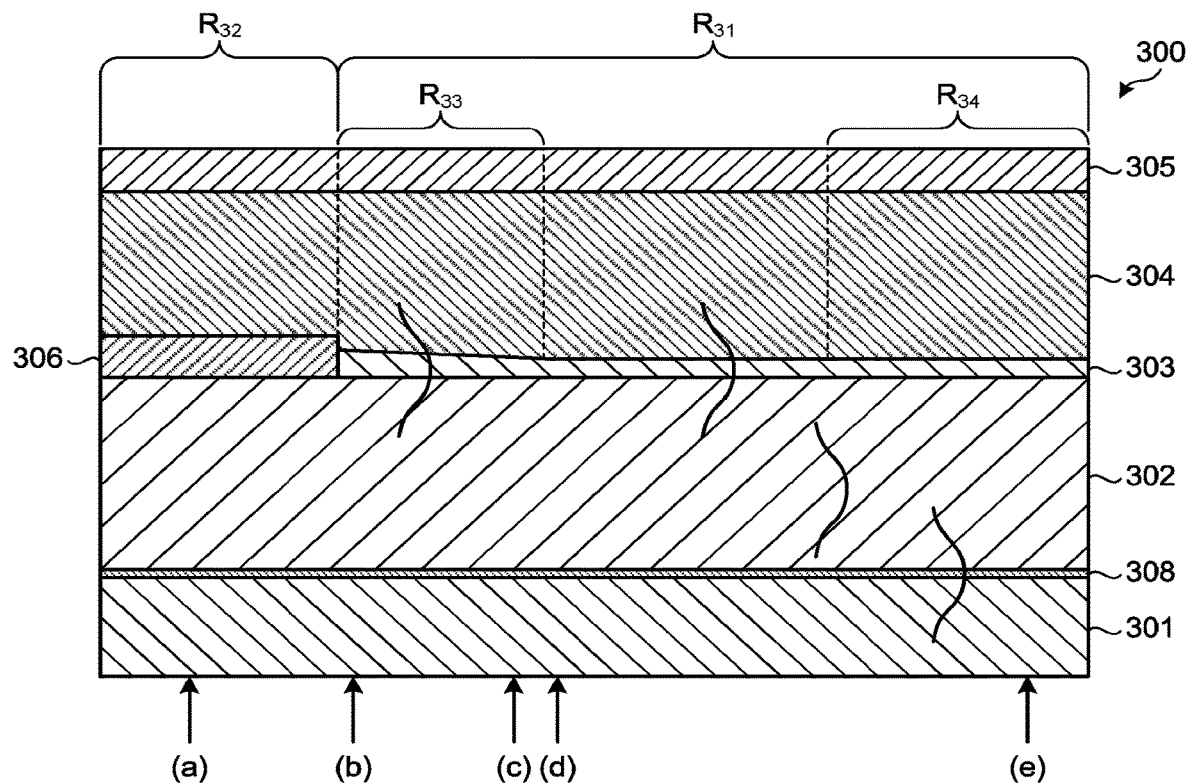
FIG. 3A is a sectional view of an optical integrated device along a waveguide direction, according to a third embodiment.
Figure 3B:
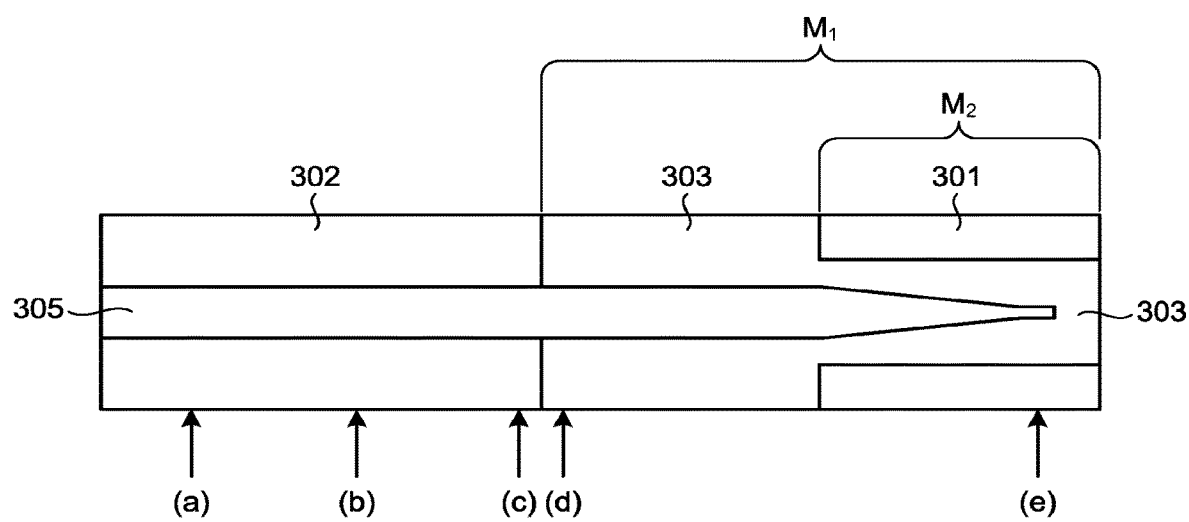
FIG. 3B is a top view of the optical integrated device according to the third embodiment.

FIG. 3A is a sectional view of an optical integrated device in a waveguide direction, according to a third embodiment; FIG. 3B is a top view of the optical integrated device according to the third embodiment; and FIG. 3C is sectional views of the optical integrated device according to the third embodiment. Arrows (a) to (e) illustrated in FIG. 3A and FIG. 3B correspond to locations of cross sections illustrated in FIG. 3C. An optical integrated device 300 illustrated in FIG. 3A to FIG. 3C will be described as an example of a configuration used in a joint region from a phase modulator to an SCC, but the optical integrated device according to the third embodiment is not limited to this combination with the phase modulator. Furthermore, the optical integrated device according to the third embodiment is also applicable to a use where light of a 1.55 μm wavelength band is incident on any of left and right facets in FIG. 3A or FIG. 3B.

As illustrated in FIG. 3A, an optical integrated device 300 includes a passive waveguide region $R_{31}$ where an SSC core 308, a lower cladding layer 302, a waveguide core 303, an upper cladding layer 304, and a contact layer 305 have been sequentially layered on a substrate 301. Furthermore, the optical integrated device 300 includes, as an example of a configuration having the phase modulator integrated into the same device, a modulator region $R_{32}$ where the SSC core 308, the lower cladding layer 302, a modulator core 306, the upper cladding layer 304, and the contact layer 305 have been sequentially layered on the substrate 301.

Specifically, the optical integrated device 300 has the SSC core 308 layered on the substrate 301. For example, the substrate 301 is an InP substrate. The SSC core 308: is a core for spot size conversion; is formed of, for example, GaInAsP having a refractive index of 3.34; and has a layer thickness of 100 nm. Instead of directly layering the SSC core 308 on the substrate 301, separate InP may be layered on the substrate 301 and the SSC core 308 may be layered thereon.

For example, the lower cladding layer 302 is n-doped InP, and has a layer thickness of 1500 nm. Furthermore, the optical integrated device 300 has the modulator core 306 and the waveguide core 303 that are formed on the lower cladding layer 302, and the modulator core 306 and the waveguide core 303 are crystallographically connected (butt-jointed) to each other. For example, the modulator core 306 is formed of an AlGaInAs multiple quantum well, and has a layer thickness of 500 nm. The waveguide core 303 is formed of GaInAsP having a refractive index of 3.39, and is formed to have a refractive index higher than those of the lower cladding layer 302 and the upper cladding layer 304.

The waveguide core 303 and the modulator core 306 have the upper cladding layer 304 layered thereon. For example, the upper cladding layer 304 is p-doped InP, and has a layer thickness of 2 μm. Furthermore, the upper cladding layer 304 has the contact layer 305 layered thereon. For example, the contact layer 305 is p-doped InGaAs, and has a layer thickness of 500 nm.

The passive waveguide region $R_{31}$ includes a first spot size conversion region $R_{33}$ where the layer thickness of the waveguide core 303 changes over a range from a portion thereof (around (b) in the figures) connected to the modulator core 306 to a predetermined location (around (c) in the figures). The waveguide core 303 in the first spot size conversion region $R_{33}$ has a layer thickness of 400 nm at the portion connected to the modulator core 306 and becomes thinner to 200 nm therefrom. Confinement of light is also changed by the change in the layer thickness of the waveguide core 303 in the first spot size conversion region $R^{33}$, and the mode field diameter of light guided through the waveguide core 303 is also converted.

Furthermore, the passive waveguide region $R_{31}$ includes, as illustrated in FIG. 3B and FIG. 3C described later, a second spot size conversion region $R_{34}$ having a two-stage mesa structure. That is, the optical integrated device 300 has a configuration having, incorporated therein, a two-stage spot size converter formed of the first spot size conversion region $R_{33}$ and the second spot size conversion region $R_{34}$. Moreover, the second spot size conversion region $R_{34}$ is arranged adjacently to a facet of the optical integrated device 300. In addition, the first spot size conversion region $R_{33}$ is arranged between the modulator region $R_{31}$ and the second spot size conversion region $R_{34}$.

Described below while reference is made parallelly to FIG. 3A to FIG. 3C are mesa structures in different regions of the optical integrated device 300.

As illustrated in FIG. 3A and FIG. 3C, the optical integrated device 300 has three types of mesa structures. That is, the optical integrated device 300 has, formed therein: in the modulator region $R_{31}$ and the first spot size conversion region $R_{33}$, a high mesa structure protruding in a mesa shape from a part of the lower cladding layer 302 through to an upper surface of the contact layer 305; in the passive waveguide region $R_{31}$ other than the first spot size conversion region $R_{33}$, a first mesa structure $M_1$ that is a low mesa structure protruding in a mesa shape including the contact layer 305 and the upper cladding layer 304; and in the second spot size conversion region $R_{34}$, in addition to the first mesa structure $M_1$, a second mesa structure $M_2$ protruding in a mesa shape including the waveguide core 303, the lower cladding layer 302, the SSC core 308, and a part of the substrate 301. Since the second spot size conversion region $R_{34}$ forms a part of the passive waveguide region $R_{31}$ other than the first spot size conversion region $R_{33}$, the second spot size conversion region $R_{34}$ has the first mesa structure $M_1$ and the second mesa structure $M_2$, formed therein.

More specifically, as illustrated in FIG. 3C(a), a high mesa structure is formed in the modulator region $R_{32}$ in the optical integrated device 300, the high mesa structure protruding in a mesa shape from a part of the lower cladding layer 302 through to the upper surface of the contact layer 305. Therefore, as illustrated in FIG. 3B, in the top view of the phase modulator region in the optical integrated device 300, the lower cladding layer 302 appears on both sides of the mesa structure.

As illustrated in FIG. 3C(b) and FIG. 3C(c), the first spot size conversion region $R_{33}$ in the optical integrated device 300 has, formed therein, a high mesa structure protruding in a mesa shape from a part of the lower cladding layer 302 through to the upper surface of the contact layer 305. However, as understood by comparing FIG. 3C(b) and FIG. 3C(c), the waveguide core 303 has different layer thicknesses therein such that a function of converting the spot size is provided. Furthermore, as illustrated in FIG. 3B, in the top view of the first spot size conversion region $R_{33}$, the lower cladding layer 302 appears on both sides of the mesa structure.

As illustrated in FIG. 3C(d), a passive waveguide region $R_{31}$ that is not the first spot size conversion region $R_{33}$ nor the second spot size conversion region $R_{34}$, in the optical integrated device 300, has, formed therein, the first mesa structure $M_1$ that is a low mesa structure protruding in a mesa shape from an upper surface of the waveguide core 303 through to the upper surface of the contact layer 305. As illustrated in FIG. 3B, in the top view of the passive waveguide region $R_{31}$ that is not the first spot size conversion region $R_{33}$ nor the second spot size conversion region $R_{34}$, the waveguide core 303 appears on both sides of the mesa structure. The upper cladding layer 304 may appear on the surface on both sides of the mesa structure instead.

Similarly to the optical integrated device 100 according to the first embodiment, in the optical integrated device 300 also, the waveguide having the high mesa structure is converted in the middle to the waveguide having the low mesa structure. Therefore, in the optical integrated device 300 also, similarly to the optical integrated device 100 according to the first embodiment, by providing an intermediate region between the waveguide having the high mesa structure and the waveguide having the low mesa structure and realizing confinement of light in the intermediate region, the confinement of light being different from those in the high mesa structure and low mesa structure, loss in optical connection between the waveguide having the high mesa structure and the waveguide having the low mesa structure is preferably reduced.

As illustrated in FIG. 3C(e), the second spot size conversion region $R_{34}$ in the optical integrated device 300 has, formed therein: the first mesa structure $M_1$ that is a low mesa structure protruding in a mesa shape from the upper surface of the waveguide core 303 through to the upper surface of the contact layer 305; and the second mesa structure $M_2$ protruding in a mesa shape including the waveguide core 303, the lower cladding layer 302, the SSC core 308, and a part of the substrate 301. Similarly to the optical integrated device 200 according to the second embodiment, the first mesa structure $M_1$ and the second mesa structure $M_2$ in the second spot size conversion region $R_{34}$ of the optical integrated device 300 enable conversion of the spot size by adiabatical shift of the mode field of light being guided through the waveguide core 303, to the SSC core 308.

As illustrated in FIG. 3A to FIG. 3C, the width of the mesa structures in the optical integrated device 300 is constant, except in the second spot size conversion region $R_{34}$, and is, for example, 2.0 μm. On the contrary, the width of the first mesa structure $M_1$ in the second spot size conversion region $R_{34}$ of the optical integrated device 300 continuously decreases toward the facet. As illustrated in FIG. 3B, the width of the first mesa structure $M_1$ is preferably constant, for example, 0.5 μm, at a trailing end portion thereof, and is preferably structured to come to an end (such that the width becomes zero) in the middle without being extended to the facet of the optical integrated device 300. Similarly to the second embodiment, this is to obtain the effect of reducing the variation in the spot size conversion.

Described below while reference is made to FIG. 3A is a configuration of the optical integrated device 300 in terms of a manufacturing method thereof.

In a method of manufacturing the optical integrated device 300, firstly, by using the metal organic chemical vapor deposition (MOCVD) method, GaInAsP serving as the SSC core 308, n-InP serving as the lower cladding layer 302, an AlGaInAs multiple quantum well layer serving as the modulator core 306, and p-InP that is a part of the upper cladding layer 304 are sequentially formed on an InP substrate serving as the substrate 301.

Subsequently, after a SiNx film is deposited on the entire surface of the p-InP layer that is the part of upper cladding layer 304, patterning is performed to obtain a pattern slightly wider than the phase modulator, layers up to the AlGaInAs multiple quantum well layer are etched away with the SiNx film serving as a mask, and the n-InP layer serving as the lower cladding layer 302 is exposed.

Subsequently, by using as is the SiNx film as a mask for selective growth, GaInAsP serving as the waveguide core 303, and p-InP serving as the upper cladding layer 304 are sequentially layered thereon, by the MOCVD method. Upon this layering, film thicknesses of the flat region and the selective growth region are adjusted to be in a ratio of about 1:2. Thereafter, after removing the SiNx film, p-InP serving as the upper cladding layer 304 and p-InGaAs serving as the contact layer 305 are layered thereon by the MOCVD method.

Subsequently, after a SiNx film is formed on the entire surface again, patterning and etching for the first mesa structure $M_1$ that is the low mesa structure are performed; after the SiNx film is removed once, a SiNx film is formed on the entire surface; and patterning and etching for the high mesa structure and the second mesa structure $M_2$ are concurrently performed.

Thereafter, by known methods, a passivation film, a resin layer and its opening, and electrodes for electric current injection and voltage application are formed in respective portions. After processing of the surface is finished, the substrate is polished so as to have a desired thickness, and an electrode is formed on the underside if required. Furthermore, facets are formed by cleavage of the substrate, facet coating and element isolation are performed, and the optical integrated device 300 is completed.

Due to the above described structure, the optical integrated device 300 enables a device having a thick waveguide layer like a phase modulator and a two-stage spot size converter to be integrated into a single device, and the spot size converter is able to widen the spot size from a little less than 1 μm to about 3 μm, the spot size being measured as the full width at $1/e^2$.

Furthermore, as described above, since a device having a thick waveguide core layer like a phase modulator and a two-stage spot size converter are able to be integrated into a single device by performing crystal growth twice and mesa structure formation twice, the optical integrated device 300 is able to be manufactured easily. The above described optical integrated device 300 includes the two-stage mesa structure having the first mesa structure $M_1$ and the second mesa structure $M_2$, but increasing the number of stages in this mesa structure does not cause deviation from the gist of the present disclosure.

The above described optical integrated device 300 according to the third embodiment enables efficient spot size conversion through the two-stage spot size converter formed of the first spot size conversion region $R_{33}$ and the second spot size conversion region $R_{34}$ even if an element having a thick waveguide layer like a phase modulator is integrated therein. That is, since confinement of light is strong and the spot size is small in an element having a thick waveguide layer like a phase modulator, it is difficult to cause light to be shifted from the waveguide core 303 to the SSC core 308 as it is. In contrast, the configuration according to the third embodiment enables efficient spot size conversion because the thickness of the waveguide layer is changed in the first spot size conversion region $R_{33}$ and light is shifted from the waveguide core 303 to the SSC core 308 thereafter.

Fourth Embodiment

Figure 4:
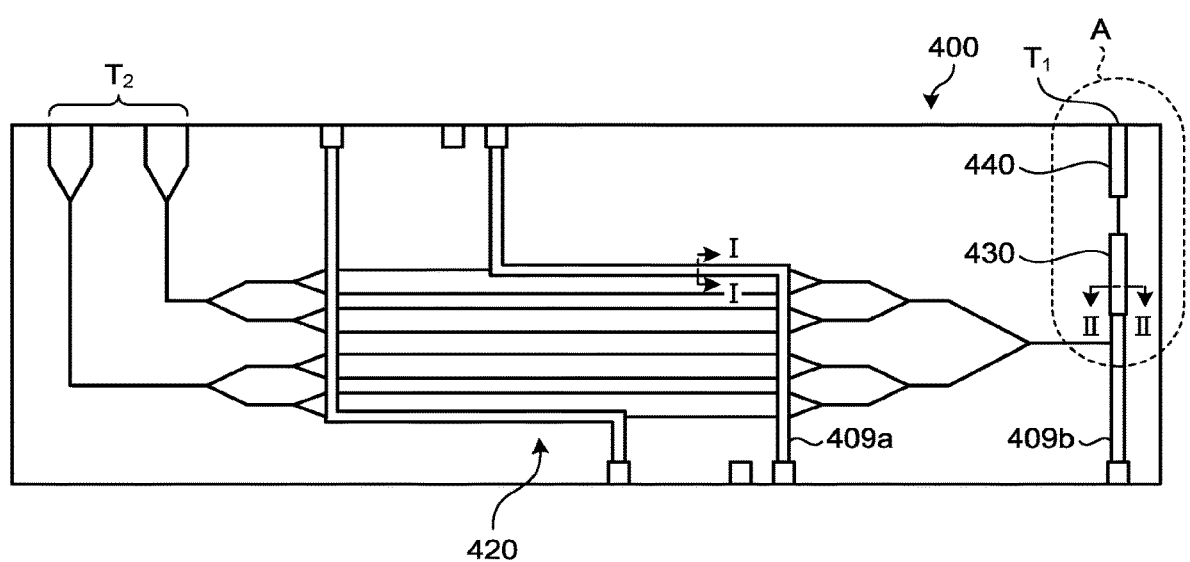
FIG. 4 is a schematic top view of an optical integrated device according to a fourth embodiment.

An optical integrated device 400 according to a fourth embodiment is an embodiment that is more practical and has all of the features of the first embodiment to the third embodiment applied to the single optical integrated device 400. FIG. 4 is a schematic top view of the optical integrated device 400 according to the fourth embodiment.

As illustrated in FIG. 4, the optical integrated device 400 according to the fourth embodiment is an optical integrated device having an IQ modulator 420 of the Mach-Zehnder type, an SOA 430, and an SSC 440, which have been integrated into the single device. For example, the optical integrated device 400 is used as a modulator that modulates light entering from an end portion $T_1$ thereof and outputs the modulated light from an end portion $T_2$ thereof. An IQ modulator is a modulator that applies modulation to both amplitude and phase of light.

As illustrated in FIG. 4, the optical integrated device 400 has a so-called U-turn configuration where the IQ modulator 420 is arranged orthogonally to the SOA 430 and SSC 440, and enables the mounting area of the optical integrated device 400 to be decreased.

What is more, in terms of plane orientation of the substrate, the optical integrated device 400 having the U-turn configuration facilitates wet etching in fabrication of mesa structures of the IQ modulator 420, the SOA 430, and the SSC 440. Specifically, the mesa structures of the SOA 430 and SSC 440 are preferably fabricated in a direction parallel to the direction of the substrate, and the mesa structure of the IQ modulator 420 is preferably fabricated in a direction parallel to the [01-1] direction of the substrate. Incidentally, the IQ modulator 420 causes phase change by using the quantum-confined Stark effect. The Pockels effect in the [01-1] direction acts with the same sign as the Stark effect and the Pockels effect in the [011] direction acts with a sign opposite to that of the Stark effect. Therefore, if the mesa structure is fabricated in the [01-1] direction, the efficiency of the phase change in the IQ modulator 420 is improved. That is, in a case where the up-down direction in FIG. 4 is the direction of the substrate and the left-right direction therein is the [01-1] direction of the substrate, if the IQ modulator 420 is arranged to be orthogonal to the SOA 430 and SSC 440, each of the IQ modulator 420, SOA 430, and SSC 440 will be suitably arranged with respect to the plane orientation of the substrate.

In the optical integrated device 400, the SOA 430 and the SSC 440 are inserted only upstream of the IQ modulator 420, but they may be inserted also downstream therefrom. Or, the SOA 430 and the SSC 440 may be inserted only downstream from the IQ modulator 420.

Figure 5A:
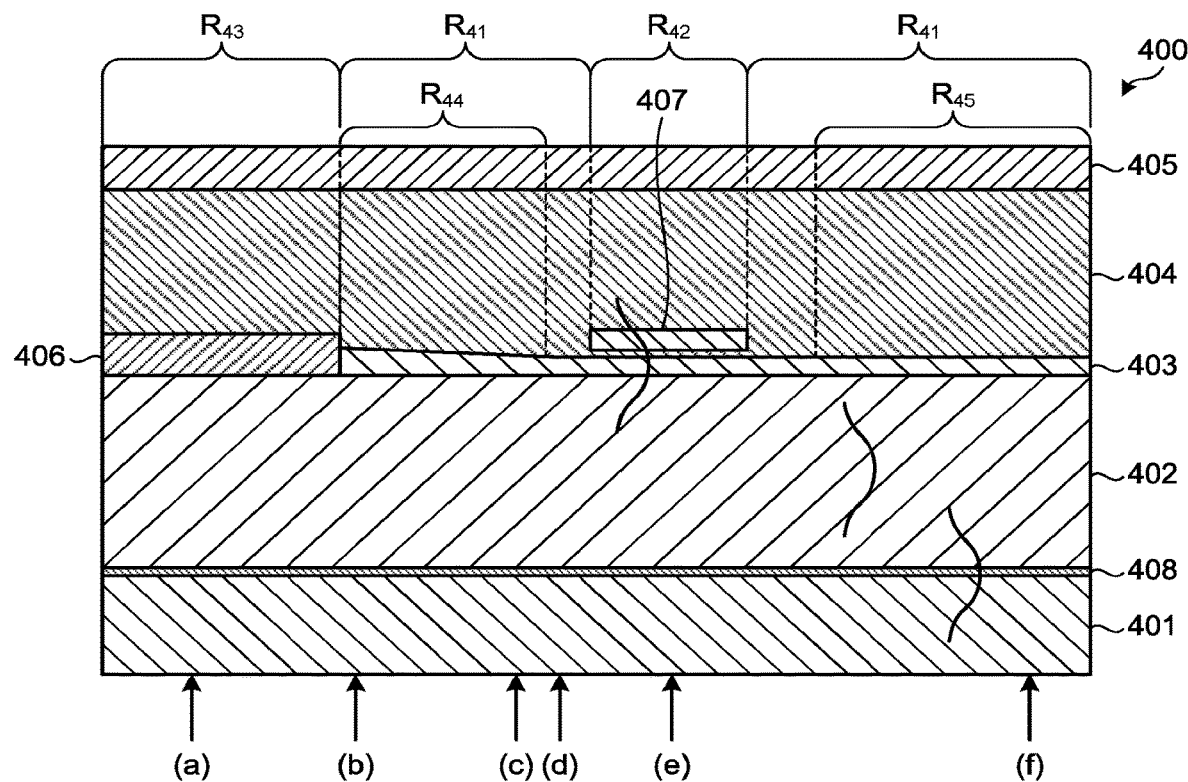
FIG. 5A is a sectional view of the optical integrated device along a waveguide direction, according to the fourth embodiment.
Figure 5B:
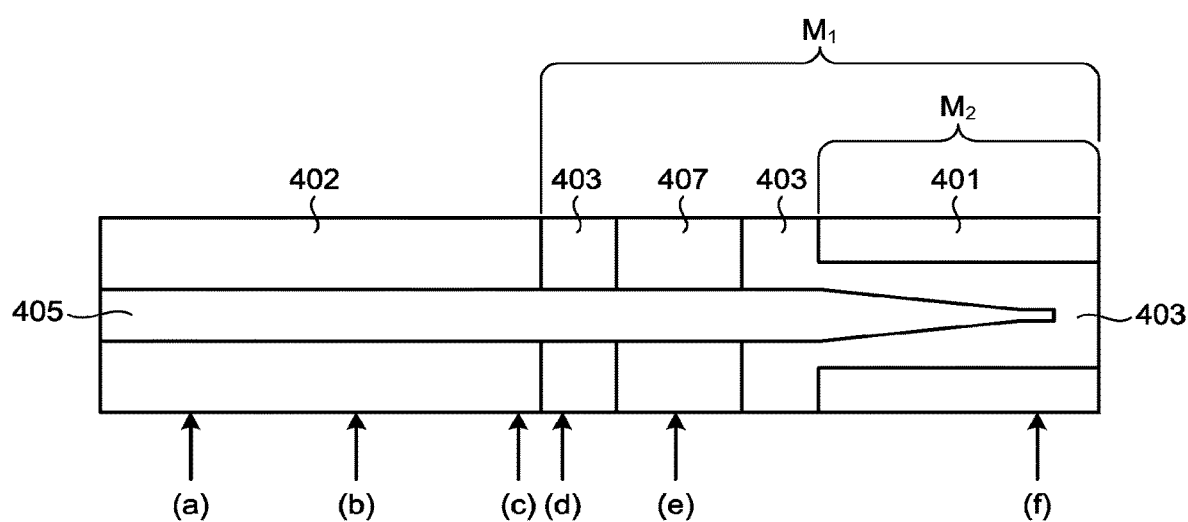
FIG. 5B is a top view of the optical integrated device according to the fourth embodiment.
Figure 5C:
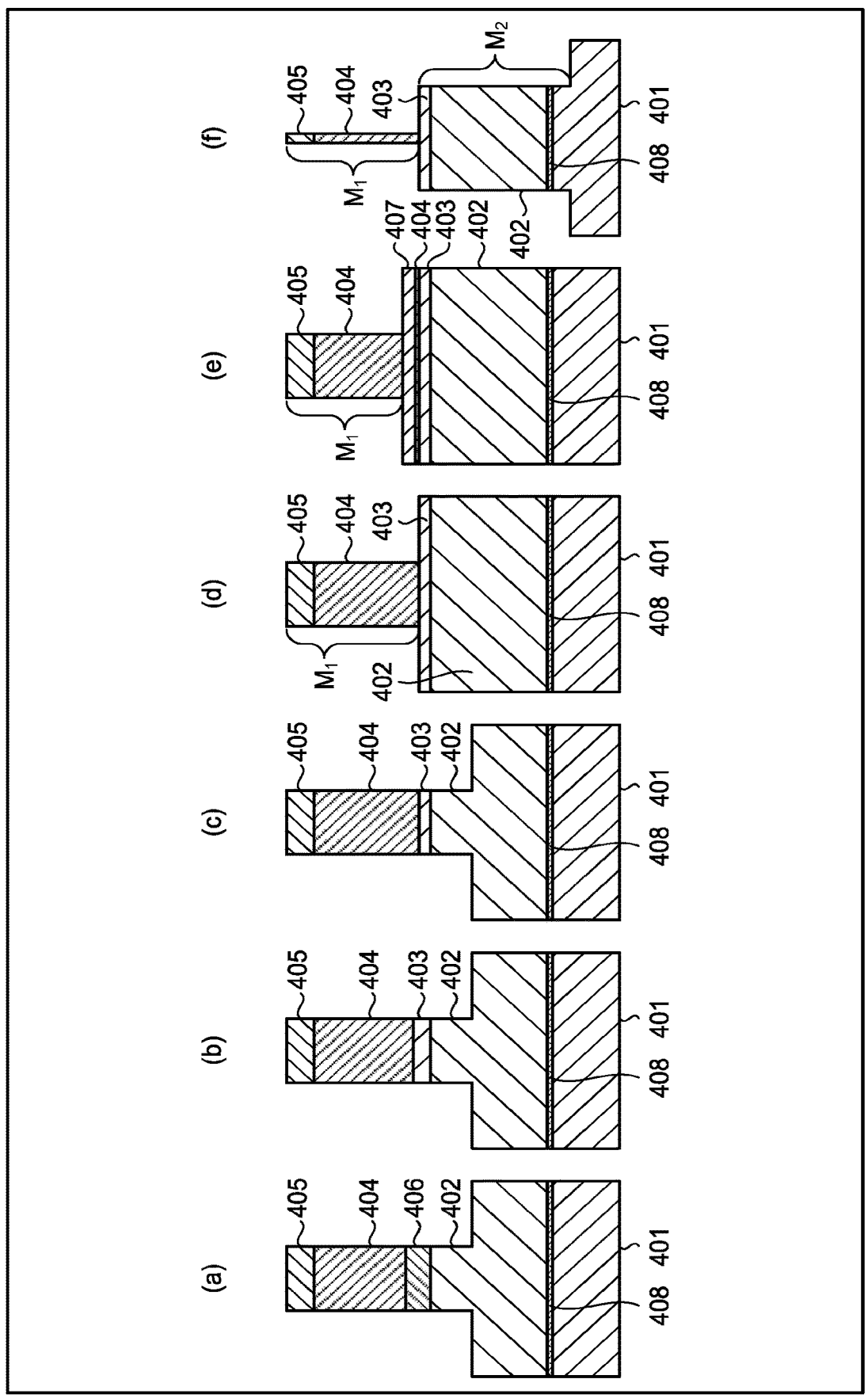
FIG. 5C is sectional views of the optical integrated device according to the fourth embodiment.

FIG. 5A is a sectional view of an optical integrated device in a waveguide direction, according to the fourth embodiment; FIG. 5B is a top view of the optical integrated device according to the fourth embodiment; and FIG. 5C is sectional views of the optical integrated device according to the fourth embodiment. Arrows (a) to (f) illustrated in FIG. 5A and FIG. 5B correspond to locations of cross sections illustrated in FIG. 5C. Furthermore, the optical integrated device 400 illustrated in FIG. 5A to FIG. 5C only represents a portion corresponding to an A-area illustrated in FIG. 4.

As illustrated in FIG. 5A, the optical integrated device 400 includes: a passive waveguide region $R_{41}$ where an SSC core 408, a lower cladding layer 402, a waveguide core 403, an upper cladding layer 404, and a contact layer 405 have been sequentially layered on a substrate 401; an active region $R_{42}$ where the SSC core 408, the lower cladding layer 402, the waveguide core 403, a quantum well layer 407, the upper cladding layer 404, and the contact layer 405 have been sequentially layered on the substrate 401; and a modulator region $R_{43}$ where the SSC core 408, the lower cladding layer 402, a modulator core 406, the upper cladding layer 404, and the contact layer 405 have been sequentially layered on the substrate 401.

Specifically, the optical integrated device 400 has the SSC core 408 layered on the substrate 401. For example, the substrate 401 is an InP substrate. The SSC core 408: is a core for spot size conversion; is formed of, for example, GaInAsP having a refractive index of 3.34; and has a layer thickness of 100 nm.

For example, the lower cladding layer 402 is n-doped InP, and has a layer thickness of 1500 nm. Furthermore, the optical integrated device 400 has the modulator core 406 and the waveguide core 403 formed on the lower cladding layer 402, and the modulator core 406 and the waveguide core 403 are crystallographically connected (butt-jointed) to each other. For example, the modulator core 406 is formed of an AlGaInAs multiple quantum well, and has a layer thickness of 500 nm. The waveguide core 403, for example, is formed of GaInAsP having a refractive index of 3.39, and is formed to have a refractive index higher than those of the lower cladding layer 402 and the upper cladding layer 404.

Furthermore, as illustrated in FIG. 5A, the quantum well layer 407 is provided near the waveguide core 403 in the active region $R_{42}$. Being near the waveguide core 403 means being near the waveguide core 403 in a range of the mode field of light guided through the waveguide core 403, and a layer (an intermediate layer) made of a material having a composition different from those of the waveguide core 403 and the quantum well layer 407 and having the same composition as the upper cladding layer 404 is interposed between the waveguide core 403 and the quantum well layer 407. The intermediate layer may be made of a material having the same composition as the lower cladding layer 402. The quantum well layer 407, for example, is formed of a GaInAsP multiple quantum well, and has a layer thickness of 100 nm. The quantum well layer 407 is formed similarly to that according to the first embodiment, and functions as an active layer of the SOA.

The modulator core 406, the waveguide core 403, and the quantum well layer 407 have the upper cladding layer 404 layered thereon. For example, the upper cladding layer 404 is p-doped InP, and has a layer thickness of 2 µm. Furthermore, the upper cladding layer 404 has the contact layer 405 layered thereon. For example, the contact layer 405 is p-doped InGaAs, and has a layer thickness of 500 nm.

The passive waveguide region $R_{41}$ includes a first spot size conversion region $R_{44}$ where the layer thickness of the waveguide layer changes, over a range from a portion thereof (around (b) in the figures) connected to the modulator core 406 to a predetermined location (around (c) in the figures). The waveguide core 403 in the first spot size conversion region $R_{44}$ has a layer thickness of 400 nm at the portion connected to the modulator core 406, and becomes thinner to 200 nm therefrom. The confinement of the light is also changed by the change in the layer thickness of the waveguide core 403 in the first spot size conversion region $R_{44}$, and the mode field diameter of the light guided through the waveguide core 403 is also converted.

Furthermore, the passive waveguide region $R_{41}$ includes, as illustrated in FIG. 5B and FIG. 5C described later, a second spot size conversion region $R_{45}$ having a two-stage mesa structure. That is, the optical integrated device 400 has a configuration having, incorporated therein, a two-stage spot size converter formed of the first spot size conversion region $R_{44}$ and the second spot size conversion region $R_{45}$. Furthermore, the second spot size conversion region $R_{45}$ is arranged adjacently to a facet of the optical integrated device 400.

As illustrated in FIG. 5A, the active region $R_{42}$ is arranged between the first spot size conversion region $R_{44}$ and the second spot size conversion region $R_{45}$. Therefore, the optical integrated device 400 has the modulator region $R_{43}$, the first spot size conversion region $R_{44}$, the active region $R_{42}$, and the second spot size conversion region $R_{45}$ that are arranged in this order, and one end surface of the second spot size conversion region $R_{45}$ is exposed as the facet of the optical integrated device 400. This order does not necessarily mean the traveling direction of light, and does not eliminate the possibility of another region being inserted between any of these regions, the another region having another function.

Described below by parallel reference to FIG. 5A to FIG. 5C are mesa structures in the different regions of the optical integrated device 400.

As illustrated in FIG. 5A to FIG. 5C, the optical integrated device 400 has three types of mesa structures. That is, the optical integrated device 400 has, formed therein: in the modulator region $R_{43}$ and the first spot size conversion region $R_{44}$, a high mesa structure protruding in a mesa shape from a part of the lower cladding layer 402 through to an upper surface of the contact layer 405; in the passive waveguide region $R_{41}$ other than the first spot size conversion region $R_{44}$, a first mesa structure $M_1$ that is a low mesa structure protruding in a mesa shape including the contact layer 405 and the upper cladding layer 404; and in the second spot size conversion region $R_{45}$, a second mesa structure $M_2$ protruding in a mesa shape including the waveguide core 403, the lower cladding layer 402, the SSC core 408, and a part of the substrate 401. Since the second spot size conversion region $R_{45}$ forms a part of the passive waveguide region $R_{41}$ other than the first spot size conversion region $R_{44}$, the second spot size conversion region $R_{45}$ has, formed therein, the first mesa structure $M_1$ and the second mesa structure $M_2$.

More specifically, as illustrated in FIG. 5C(a), the modulator region $R_{43}$ in the optical integrated device 400 has, formed therein, a high mesa structure protruding in a mesa shape from a part of the lower cladding layer 402 through to the upper surface of the contact layer 405. Therefore, as illustrated in FIG. 5B, in the top view of the phase modulator region in the optical integrated device 400, the lower cladding layer 402 appears on both sides of the mesa structure.

As illustrated in FIG. 5C(b) and FIG. 5C(c), the first spot size conversion region $R_{44}$ in the optical integrated device 400 has, formed therein, a high mesa structure protruding in a mesa shape from a part of the lower cladding layer 402 through to the upper surface of the contact layer 405. However, as understood by comparing FIG. 5C(b) and FIG. 5C(c), the waveguide core 403 has different layer thicknesses therein such that the function of converting the spot size is provided. Furthermore, as illustrated in FIG. 5B, in the top view of the first spot size conversion region $R_{44}$, the lower cladding layer 402 appears on both sides of the mesa structure.

As illustrated in FIG. 5C(d), the passive waveguide region $R_{41}$ that is not the first spot size conversion region $R_{44}$ nor the second spot size conversion region $R_{45}$ in the optical integrated device 400 has, formed therein, the first mesa structure $M_1$ that is a low mesa structure protruding in a mesa shape including to the upper cladding layer 404 and the contact layer 405. As illustrated in FIG. 5B, in the top view of the passive waveguide region $R_{41}$ that is not the first spot size conversion region $R_{44}$ nor the second spot size conversion region $R_{45}$, the waveguide core 403 appears on both sides of the mesa structure. The upper cladding layer 404 may appear on the surface on both sides of the mesa structure instead.

Similarly to the optical integrated device 100 according to the first embodiment, in the optical integrated device 400 also, the waveguide having the high mesa structure is converted in the middle to the waveguide having the low mesa structure. Therefore, similarly to the optical integrated device 100, in the optical integrated device 400 also, by providing an intermediate region between the waveguide having the high mesa structure and the waveguide having the low mesa structure, and realizing, in the intermediate region, confinement of light different from those of the high mesa structure and the low mesa structure, loss in optical connection between the waveguide having the high mesa structure and the waveguide having the low mesa structure is preferably reduced.

As illustrated in FIG. 5C(e), the active region $R_{42}$ in the optical integrated device 400 has, formed therein, a low mesa structure protruding in a mesa shape including the upper cladding layer 404 up to the top of the quantum well layer 407. Therefore, as illustrated in FIG. 5B, in the top view of the active region $R_{42}$, the quantum well layer 407 appears on both sides of the mesa structure. The upper cladding layer 404 may appear on the surface on both sides of the mesa structure instead.

As illustrated in FIG. 5C(f), the second spot size conversion region $R_{45}$ in the optical integrated device 400 has, formed therein: the first mesa structure $M_1$ that is a low mesa structure protruding in a mesa shape including the upper cladding layer 404 and the contact layer 405; and the second mesa structure $M_2$ protruding in a mesa shape including the waveguide core 403, the lower cladding layer 402, the SSC core 408, and a part of the substrate 401. Similarly to the optical integrated device 200 according to the second embodiment, the first mesa structure $M_1$ and the second mesa structure $M_2$ in the second spot size conversion region $R_{45}$ of the optical integrated device 400 convert the spot size by adiabatic shift of the mode field of light guided through the waveguide core 403, to the SSC core 408.

As illustrated in FIG. 5A to FIG. 5C, the width of the mesa structures in the optical integrated device 400 is constant except for the second spot size conversion region $R_{45}$, and is, for example, 2.0 μm. On the contrary, the width of the first mesa structure $M_1$ in the second spot size conversion region $R_{45}$ of the optical integrated device 400 continuously decreases toward the facet. As illustrated in FIG. 5B, the width of the first mesa structure $M_1$ is preferably made constant, for example, 0.5 μm, at a trailing end portion thereof, and is preferably structured to come to an end (such that the width becomes zero) in the middle without being extended to the facet of the optical integrated device 400. Similarly to the second embodiment, this is to obtain the effect of reducing the variation in the spot size conversion.

Described below while reference is made to FIG. 5A is a configuration of the optical integrated device 400 in terms of a manufacturing method thereof.

In a method of manufacturing the optical integrated device 400, firstly, by using the metal organic chemical vapor deposition (MOCVD) method, GaInAsP serving as the SSC core 408, n-InP serving as the lower cladding layer 402, an AlGaInAs multiple quantum well layer serving as the modulator core 406, and p-InP that is a part of the upper cladding layer 404 are sequentially formed on an InP substrate serving as the substrate 401.

Subsequently, after a SiNx film is deposited on the entire surface of the p-InP layer that is a part of the upper cladding layer 404, patterning is performed to obtain a pattern slightly wider than the phase modulator, layers up to the AlGaInAs multiple quantum well layer are etched away with the SiNx film serving as a mask, and the n-InP layer serving as the lower cladding layer 402 is exposed.

Subsequently, by using, as is, the SiNx film as a mask for selective growth, GaInAsP serving as the waveguide core 403, p-InP serving as the intermediate layer between the waveguide core 403 and the quantum well layer 407, a GaInAsP multiple quantum well serving as the quantum well layer 407, and p-InP serving as the upper cladding layer 404 are sequentially formed by the MOCVD method. Upon this layering, film thicknesses of the flat region and the selective growth region are adjusted to be in a ratio of about 1:2.

Subsequently, the SiNx film is removed once, a new SiNx film is formed on the entire surface, and patterning is performed such that a region not serving as the phase modulator or the SOA is made open. With this SiNx film serving as a mask, the p-InP layer and the GaInAsP multiple quantum well layer are etched away. Thereafter, after the SiNx film is removed, p-InP that is a part of the upper cladding layer 404 and p-InGaAs serving as the contact layer 405 are layered thereon by the MOCVD method.

Subsequently, a SiNx film is formed on the entire surface again; patterning and etching for the first mesa structure $M_1$ that is a low mesa structure are performed; after the SiNx film is removed once, a SiNx film is formed on the entire surface; and patterning and etching for a high mesa structure and the second mesa structure $M_2$ are concurrently performed.

Thereafter, by known methods, a passivation film, a resin layer and its opening, and electrodes for electric current injection and voltage application are formed in respective portions. After processing of the surface is finished, the substrate is polished so as to have a desired thickness, and an electrode is formed on the underside if required. Facets are formed by cleavage of the substrate, facet coating and element isolation are performed, and the optical integrated device 400 is completed.

FIG. 6 is sectional views illustrating examples of formation of a passivation film and electrodes. FIG. 6(a) corresponds to a cross section I-I in FIG. 4, and FIG. 6(b) corresponds to a cross section II-II in FIG. 4. As illustrated in FIG. 6(a), in the cross section of the mesa structure of the IQ modulator 420: the high mesa structure protruding in the mesa shape including the contact layer 405, the upper cladding layer 404, the modulator core 406, and a part of the lower cladding layer 402 is coated with a passivation film 410 formed of a material, such as, for example, $SiO_2$ or SiNx; and a resin layer 411 formed of a resin material, such as, for example, BCB or polyimide, is formed outside the passivation film 410. In this configuration, electric current flows from an electrode 409a formed on the contact layer 405 to a ground electrode GND formed on the lower cladding layer 402. As illustrated in FIG. 6(b), in the cross section of the mesa structure of the SOA 430, the low mesa structure having the contact layer 405 and the upper cladding layer 404 protruding in the mesa shape including the contact layer 405 and the upper cladding layer 404 is coated with the passivation film 410 made of a material, such as, for example, $SiO_2$ or SiNx. In this configuration, electric current flows from an electrode 409b formed on the contact layer 405 to a ground electrode GND formed on the lower cladding layer 402.

Due to the above described structure, the optical integrated device 400 enables a device having a thick waveguide layer like the IQ modulator 420, the SOA 430, and the two-stage SSC 440 to be integrated into a single device, and the spot size converter is able to widen the spot size from a little less than 1 μm to about 3 μm, the spot size being measured as the full width at $1/e^2$.

Furthermore, as described above, the optical integrated device 400 enables a device having a thick waveguide layer like the IQ modulator 420, the SOA 430, and the two-stage SSC 440 to be integrated into a single device. The above described optical integrated device 400 has the two-stage mesa structure with the first mesa structure $M_1$ and the second mesa structure $M_2$, but increasing the number of stages in this mesa structure does not cause deviation from the gist of the present disclosure.

The above described optical integrated device 400 according to the fourth embodiment is able to have all of the advantages of the optical integrated devices according to the first embodiment to the third embodiment, and also is advantageous in that the number of times crystal growth is performed and the number of times formation of a mesa structure is performed are not increased in the manufacture thereof.

Fifth Embodiment

Figure 7:
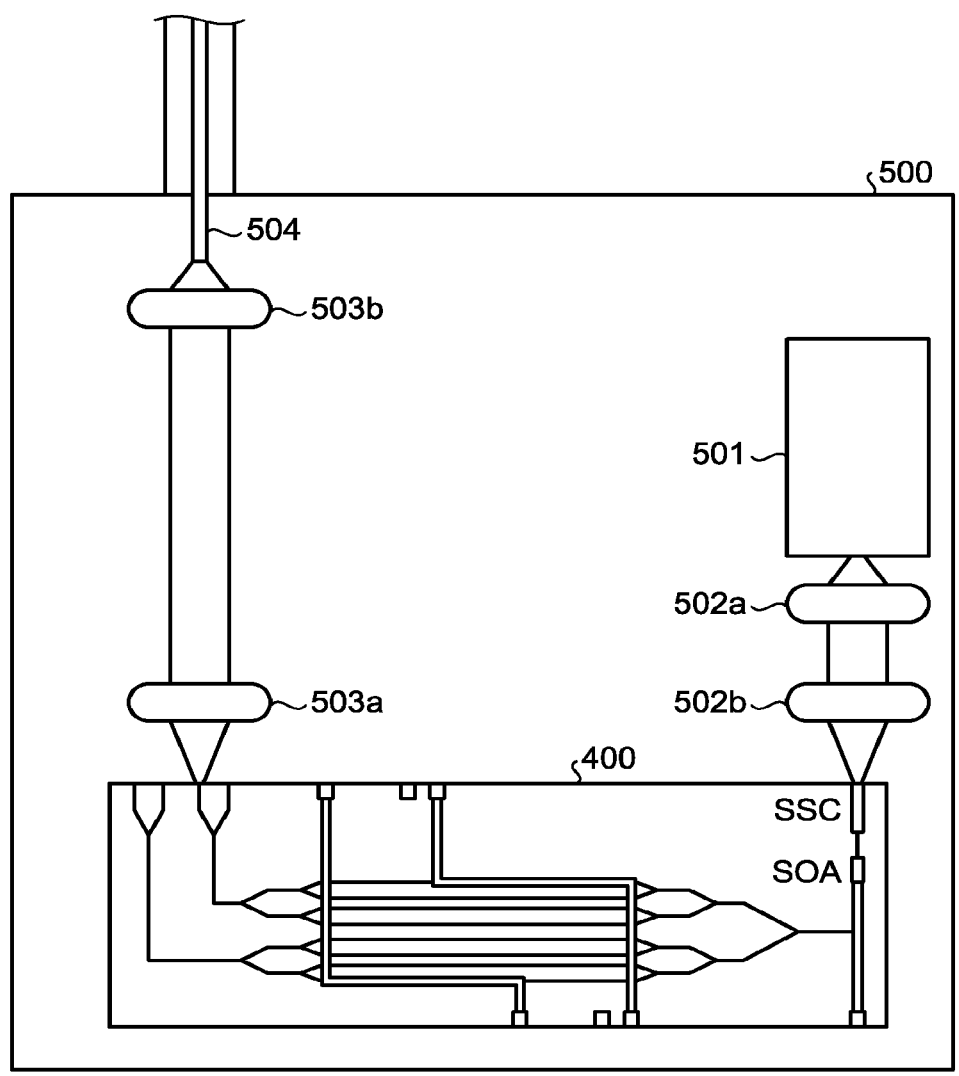
FIG. 7 is a schematic diagram of a configuration of an optical transmitter module according to a fifth embodiment.
Figure 8:
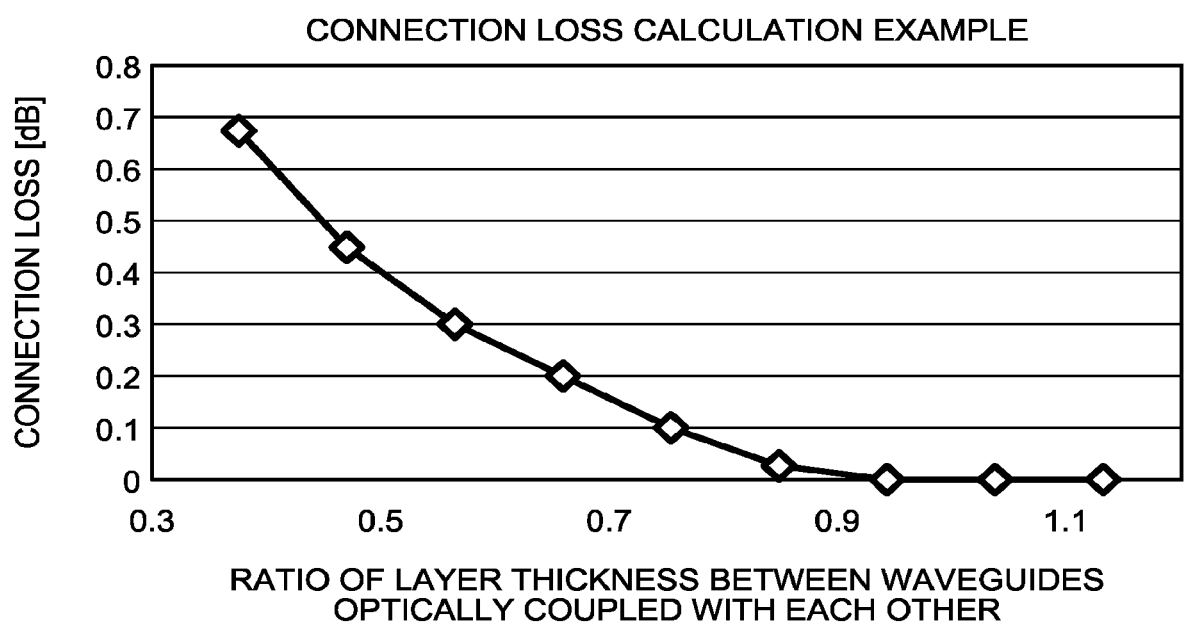
FIG. 8 is a graph illustrating an example of connection loss in waveguide layers having different thicknesses.

FIG. 7 is a schematic diagram of a configuration of an optical transmitter module according to a fifth embodiment. An optical transmitter module 500 according to the fifth embodiment is an optical transmitter module having, used therein, any one of the optical integrated devices according to the first embodiment to the fourth embodiment, and an optical transmitter module having the optical integrated device 400 according to the fourth embodiment will be described herein as an example.

As illustrated in FIG. 7, the optical transmitter module 500 includes a wavelength-variable semiconductor laser 501, first lenses 502a and 502b, the optical integrated device 400, second lenses 503a and 503b, and an optical fiber 504.

The wavelength-variable semiconductor laser 501 is a light source that outputs laser light serving as carrier waves. Laser light emitted from the wavelength-variable semiconductor laser 501 is caused to be incident on an incident facet of the optical integrated device 400 by the first lens 502b after being collimated by the first lens 502a.

The optical integrated device 400 is an optical integrated device having an IQ modulator, an SOA, and an SSC, which have been integrated into a single device as described above, and the spot size of the laser light incident on the incident facet of the optical integrated device 400 is converted by the SSC, optical power of the laser light is amplified by the SOA, and the laser light is subjected to modulation by the IQ modulator.

The laser light emitted from the optical integrated device 400 is caused to be incident on a facet of the optical fiber 504 by the second lens 503b after being collimated by the second lens 503a, and is guided by the optical fiber 504 to the exterior of the optical transmitter module 500.

Due to the function of the SSC included in the optical integrated device 400 in the optical transmitter module 500 having the above described configuration, tolerance of coupling upon incidence from the wavelength-variable semiconductor laser 501 on the optical integrated device 400 is improved. Furthermore, due to the function of the SSC included in the optical integrated device 400, tolerance of coupling upon incidence from the optical integrated device 400 on the optical fiber 504 is also improved.

The present disclosure has been described based on the embodiments above, but the present disclosure is not limited by the above described embodiments. Those configured by combination of the respective components described above as appropriate are also included in the scope of the present disclosure. Furthermore, further effects and modified examples may be easily derived by those skilled in the art. For example, the configurations of the layers of the optical integrated devices used above in the description of the embodiments just need to be in the above described order, and any of the configurations having another semiconductor layer inserted therein is also included in the scope of the present disclosure. Therefore, wider aspects of the present disclosure are not limited to the above described embodiments, and various modifications are possible.

An optical integrated device and an optical transmitter module according to the present disclosure have an effect of enabling problems caused by a mismatch between spot sizes to be reduced.

Although the disclosure has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An optical integrated device, comprising:
   a substrate;
   a passive waveguide region including:
      an upper cladding layer;
      a lower cladding layer;
      a first core layer arranged between the upper cladding layer and the lower cladding layer, the first core layer having a higher refractive index than the upper cladding layer and the lower cladding layer; and
      a second core layer arranged between the lower cladding layer and the substrate, the second core layer having a higher refractive index than the lower cladding layer and the substrate;
   an active region including:
      the upper cladding layer;
      the lower cladding layer;
      the first core layer;
      the second core layer; and
      a quantum well layer arranged within a range of a mode field of light guided through the first core layer, the quantum well layer being configured to amplify light with electric current injected thereto,
   wherein
   the active region and at least a part of the passive waveguide region have a first mesa structure having an upper cladding portion formed of a same material as the upper cladding layer, the first mesa structure protruding in a mesa shape from the first core layer,
   the passive waveguide region includes a first spot size conversion region having, in addition to the first mesa structure, a second mesa structure having a first core portion, a lower cladding portion, and a second core portion that are formed of same materials as the first core layer, the lower cladding layer, and the second core layer, respectively, the second mesa structure protruding in a mesa shape from the substrate,
   the second mesa structure has a width wider than a width of the first mesa structure, and the width of the first mesa structure continuously changes along a longitudinal direction in which light is guided through the second core portion in the passive waveguide region having the second mesa structure, the width being along a direction perpendicular to the longitudinal direction, the optical integrated device further comprising:
   an intermediate layer between the first core layer and the quantum well layer, the intermediate layer having a composition different from those of the first core layer and the quantum well layer.

2. The optical integrated device according to claim 1, wherein the intermediate layer has the same composition as the lower or upper cladding layer.

3. The optical integrated device according to claim 2, wherein the passive waveguide region includes a second spot size conversion region where the first core layer changes in layer thickness.

4. The optical integrated device according to claim 1, wherein the passive waveguide region includes a second spot size conversion region where the first core layer changes in layer thickness.

5. The optical integrated device according to claim 4, wherein the first spot size conversion region and the second spot size conversion region have the active region arranged therebetween.

6. The optical integrated device according to claim 5, wherein one end surface of the first spot size conversion region is exposed as a facet of the optical integrated device.

7. The optical integrated device according to claim 6, wherein the width of the first mesa structure in the first spot size conversion region becomes zero in the middle without the first mesa structure being extended to the facet.

8. The optical integrated device according to claim 4, wherein
   another part of the passive waveguide region includes the second spot size conversion region, and has a high mesa structure where the upper cladding layer, the first core layer, and a part of the lower cladding layer protrude in a mesa shape, and
   the first mesa structure and the high mesa structure are optically connected to each other.

9. The optical integrated device according to claim 8, further comprising:
   on the substrate, a modulator region that functions as a phase modulator that modulates phase of light guided therethrough.

10. The optical integrated device according to claim 9, wherein a modulator core layer that guides light in the modulator region is butt-jointed to the first core layer.

11. An optical transmitter module, comprising the optical integrated device according to claim 4.

12. An optical integrated device, comprising:
    a substrate;
    a passive waveguide region where a lower cladding layer, a first core layer having a refractive index higher than that of the lower cladding layer, and an upper cladding layer having a refractive index lower than that of the first core layer have been sequentially layered on the substrate; and
    an active region where the lower cladding layer, the first core layer, a quantum well layer that amplifies light by electric current being injected into the quantum well layer, and the upper cladding layer have been sequentially layered on the substrate, wherein
    the first core layer and the quantum well layer are close to each other in a range of a mode field of light guided through the first core layer, and
    the passive waveguide region includes a first spot size conversion region where the first core layer changes in layer thickness,
    the passive waveguide region having a high mesa structure having a first core portion, a lower cladding portion, and an upper cladding portion that are formed of same materials as the first core layer, the lower cladding layer, and the upper cladding layer, respectively, the mesa structure protruding in a mesa shape from the substrate, wherein
    a width of the high mesa structure is constant over the entire length from the passive waveguide region, including the first spot size conversion region, to the active region, the layer thickness of the first core layer being reduced toward the active region, wherein in the spot size conversion region of the high mesa structure, a part of the lower cladding layer protrudes in the mesa shape through the first core layer, the active waveguide region having a low mesa structure having a quantum well portion, an upper cladding portion, and a first core portion, that are formed of same materials as the quantum well layer, the upper cladding layer, and the first core layer, respectively, the low mesa structure protruding in a mesa shape from an upper part of the lower cladding layer, wherein the upper cladding layer protrudes in the mesa shape to the upper part of the quantum well layer.

13. The optical integrated device according to claim 12, wherein another part of the passive waveguide region includes the first spot size conversion region, and has a high mesa structure where the upper cladding layer, the first core layer, and a part of the lower cladding layer protrude in a mesa shape, and the first mesa structure and the high mesa structure are optically connected to each other.

14. The optical integrated device according to claim 13, further comprising:

on the substrate, a modulator region that functions as a phase modulator that modulates phase of light guided therethrough.

15. The optical integrated device according to claim 14, wherein a modulator core layer that guides light in the modulator region is butt-jointed to the first core layer.

16. An optical transmitter module, comprising the optical integrated device according to claim 12.

17. An optical integrated device, comprising:
a substrate;
a passive waveguide region including:
an upper cladding layer;
a lower cladding layer;
a first core layer arranged between the upper cladding layer and the lower cladding layer, the first core layer having a higher refractive index than the upper cladding layer and the lower cladding layer, wherein at least a part of the passive waveguide region has a first mesa structure having an upper cladding portion formed of a same material as the upper cladding layer, the first mesa structure protruding in a mesa shape from the first core layer, the passive waveguide region includes, in addition to the first mesa structure, a first spot size conversion region where the first core layer changes in layer thickness, and a second spot size conversion region having a second mesa structure having a first core portion, a lower cladding portion, and a second core portion that are formed of same materials as the first core layer, the lower cladding layer, and the second core layer, respectively, the second mesa structure protruding in a mesa shape from the substrate, and the second mesa structure has a width wider than a width of the first mesa structure, and the width of the first mesa structure continuously changes along a longitudinal direction in which light is guided through the second core portion in the passive waveguide region having the second mesa structure, the width being along a direction perpendicular to the longitudinal direction.

18. The optical integrated device according to claim 17, further comprising:

an active region where the second core layer, the lower cladding layer, the first core layer, a quantum well layer that amplifies light by electric current being injected into the quantum well layer, and the upper cladding layer have been sequentially layered on the substrate, wherein the first core layer and the quantum well layer are close to each other in a range of a mode field of light guided through the first core layer.

19. The optical integrated device according to claim 17, wherein another part of the passive waveguide region includes the first spot size conversion region, and has a high mesa structure where the upper cladding layer, the first core layer, and a part of the lower cladding layer protrude in a mesa shape, and the first mesa structure and the high mesa structure are optically connected to each other.

20. The optical integrated device according to claim 19, further comprising:

on the substrate, a modulator region that functions as a phase modulator that modulate phase of light guided therethrough.

21. The optical integrated device according to claim 20, wherein a modulator core layer that guides light in the modulator region is butt-jointed to the first core layer.

22. An optical transmitter module, comprising the optical integrated device according to claim 17.

* * * * *